United States Patent
Yoshida et al.

(10) Patent No.: US 7,484,166 B2
(45) Date of Patent: Jan. 27, 2009

(54) SEMICONDUCTOR INTEGRATED CIRCUIT VERIFICATION METHOD AND TEST PATTERN PREPARATION METHOD

(75) Inventors: Takaki Yoshida, Osaka (JP); Keisuke Ochi, Osaka (JP)

(73) Assignee: Panasonic Corporation, Osaka (JP)

( * ) Notice: Subject to any disclaimer, the term of this patent is extended or adjusted under 35 U.S.C. 154(b) by 270 days.

(21) Appl. No.: 11/006,669

(22) Filed: Dec. 8, 2004

(65) Prior Publication Data

US 2005/0149790 A1  Jul. 7, 2005

(30) Foreign Application Priority Data

Dec. 10, 2003  (JP)  ............... 2003-411380

(51) Int. Cl.
*G06F 11/00* (2006.01)
*G11B 20/20* (2006.01)

(52) U.S. Cl. ................. 714/798; 714/700

(58) Field of Classification Search ........... 714/700, 714/731, 744, 798
See application file for complete search history.

(56) References Cited

U.S. PATENT DOCUMENTS

| | | | |
|---|---|---|---|
| 5,760,599 A | | 6/1998 | Ehiro |
| 6,327,686 B1 * | 12/2001 | Grundmann et al. ........ 714/738 |
| 6,405,336 B1 * | 6/2002 | Ohashi ........................ 714/738 |
| 6,453,437 B1 * | 9/2002 | Kapur et al. ................ 714/741 |
| 6,470,468 B1 * | 10/2002 | Fukui .......................... 714/744 |
| 6,522,122 B2 * | 2/2003 | Watanabe et al. ........ 324/76.77 |
| 6,528,982 B1 * | 3/2003 | Yanagisawa et al. .... 324/76.77 |
| 7,039,845 B2 * | 5/2006 | Rearick et al. ............. 714/738 |

FOREIGN PATENT DOCUMENTS

| | | |
|---|---|---|
| JP | 2-306180 | 12/1990 |
| JP | 5-324755 | 12/1993 |
| JP | 09292436 A * | 11/1997 |
| JP | 10-198723 | 7/1998 |
| JP | 11-39357 | 2/1999 |
| JP | 11-142489 | 5/1999 |
| JP | 11-237440 | 8/1999 |

(Continued)

OTHER PUBLICATIONS

"Timing verification using statically sensitizable paths" by Benkoski et al. Computer-Aided Design of Integrated Circuits and Systems, IEEE Transactions on Publication Date: Oct. 1990 vol. 9, Issue: 10 On pp. 10723-10784 ISSN: 0278-0070 INSPEC Accession No. 3822773.*

(Continued)

*Primary Examiner*—Cynthia Britt
(74) *Attorney, Agent, or Firm*—McDermott Will & Emery LLP

(57) ABSTRACT

In the inventive semiconductor integrated circuit verification method, based upon expected values of a signal from an integrated circuit, which are obtained by RTL verification or the like, and upon signal delay information obtained by static timing analysis (STA), expected value comparison times (strobe times) of a test pattern are extracted, or expected value verification as to whether values of an actually produced signal match the expected values is performed. In this manner, the inventive method allows the test pattern to be prepared with consideration given to variation in the LSI process, temperature, voltage and the like and to constraints of the test apparatus.

20 Claims, 34 Drawing Sheets

FOREIGN PATENT DOCUMENTS

| | | | |
|---|---|---|---|
| JP | 2001-235522 | | 8/2001 |
| JP | 2003167939 A | * | 6/2003 |

OTHER PUBLICATIONS

"Path-delay fault simulation for a standard scan design methodology" by Sungho Kang et al. International Conference on Computer Design: VLSI in Computers and Processors, 1994. ICCD '94. Proceedings., IEEE Publication Date: Oct. 10-12, 1994 On pp. 359-362 ISBN: 0-8186-6565-3 INSPEC Accession No. 4801094.*

Japanese Office Action with English translation thereof issued in corresponding Japanese Patent Application No. 2003-411380, mailed Jan. 23, 2007.

Japanese Office Action Issued in corresponding Japanese Patent Application No. JP 2003-411380, dated Oct. 17, 2006.

* cited by examiner

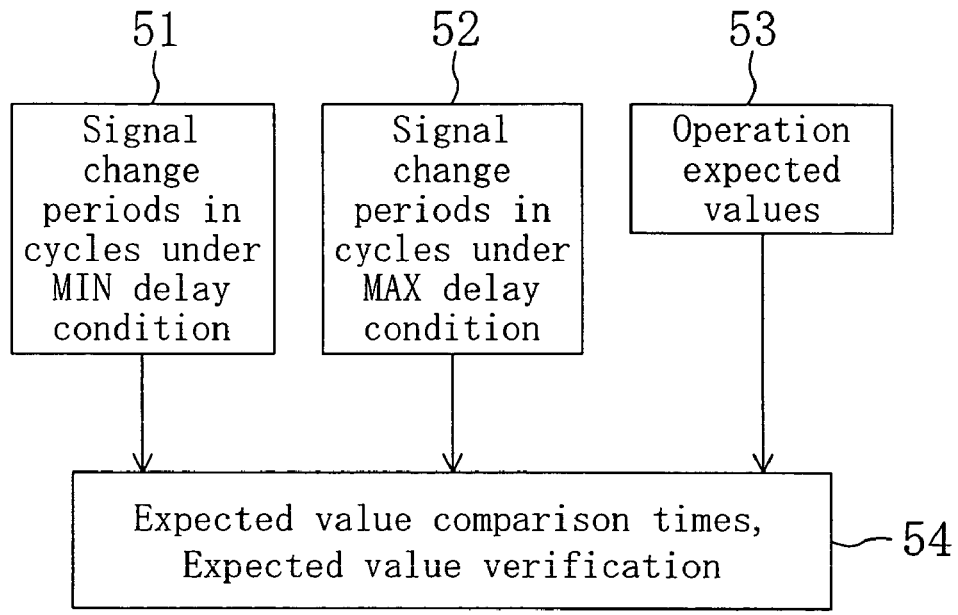
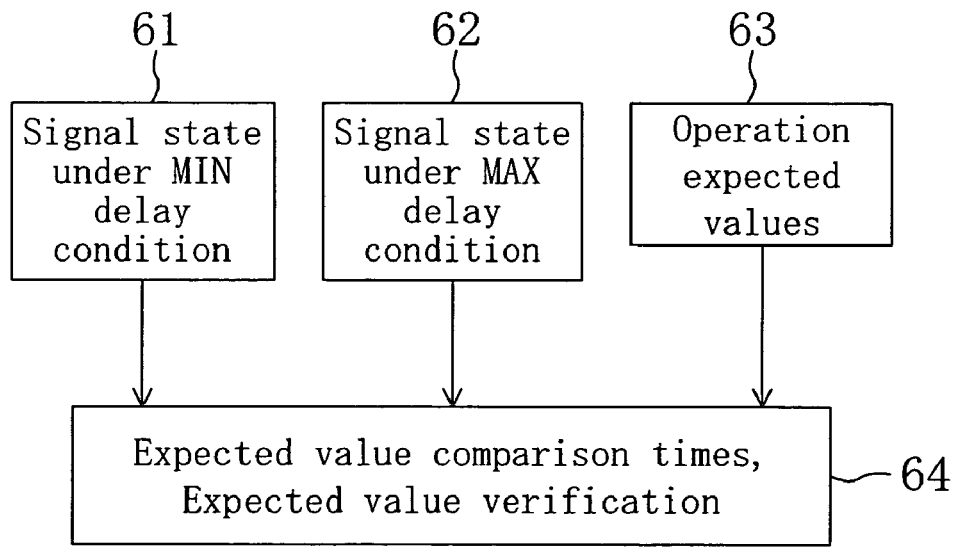

FIG. 22

| Condition | | | Transition period |
|---|---|---|---|
| Test jig | LSI spec | Type of cell used··· | |
| Test device··· | | Operation condition Frequency··· | |
| XXX | | 50MHz | H→L 0.5ns |
| ········· | | | |

FIG. 32

| Terminal | Cycle number | Signal | Delay time |
|---|---|---|---|
| OUT | 1 | L→H | 0.11ns |
| OUT | 3 | H→L | 0.45ns |
| OUT | 6 | L→H | 0.77ns |
| OUT | 7 | H→L | 0.45ns |
| ................ | | | |

FIG. 33

| Terminal | Signal | Path | Delay time |
|---|---|---|---|
| OUT | L→H | PathA | 0.11ns |
| OUT | L→H | PathB | 0.34ns |
| OUT | L→H | PathC | 0.77ns |
| OUT | L→H | PathD | 0.37ns |
| OUT | L→H | PathE | 0.44ns |
| OUT | H→L | PathA | 0.45ns |
| ................ | | | |

Although result of expected value comparison made at this point is the same as the result obtained when circuit operates properly, it is determined that the circuit does not operate correctly, because the paths used are different from each other.
(In some cases, automatic masking is performed based on information.)

FIG. 37

| Path | Signal change | No load | | Load capacity of set | | Load capacity of tester A | | Load capacity of tester B | |
|---|---|---|---|---|---|---|---|---|---|
| | | MIN | MAX (ns) | MIN | MAX (ns) | MIN | MAX (ns) | MIN | MAX (ns) |
| A | L→H | 0.01 | 0.23 | 0.06 | 0.75 | 0.11 | 0.95 | 0.41 | 1.85 |
| A | H→L | 0.33 | 0.50 | 0.41 | 1.05 | 0.45 | 1.25 | 0.75 | 1.65 |
| C | L→H | 0.55 | 0.70 | 0.72 | 1.37 | 0.77 | 1.57 | 1.00 | 1.97 |
| C | H→L | 0.50 | 0.68 | 0.67 | 1.41 | 0.81 | 1.61 | 1.12 | 2.01 |
| ... | | | | | | | | | |

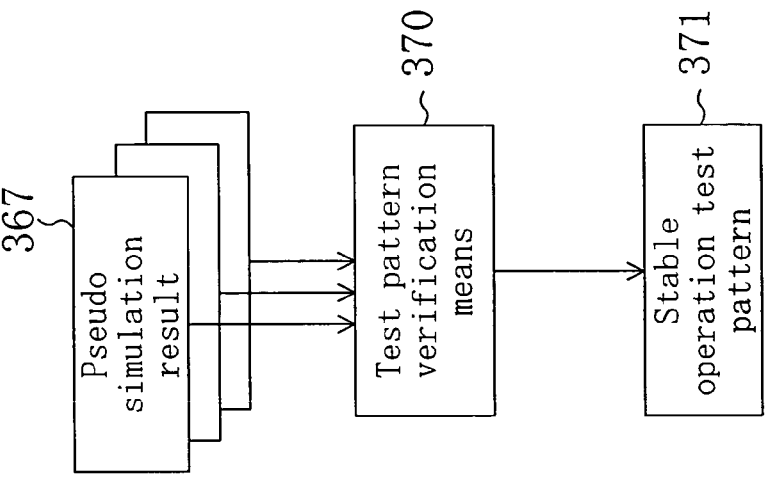
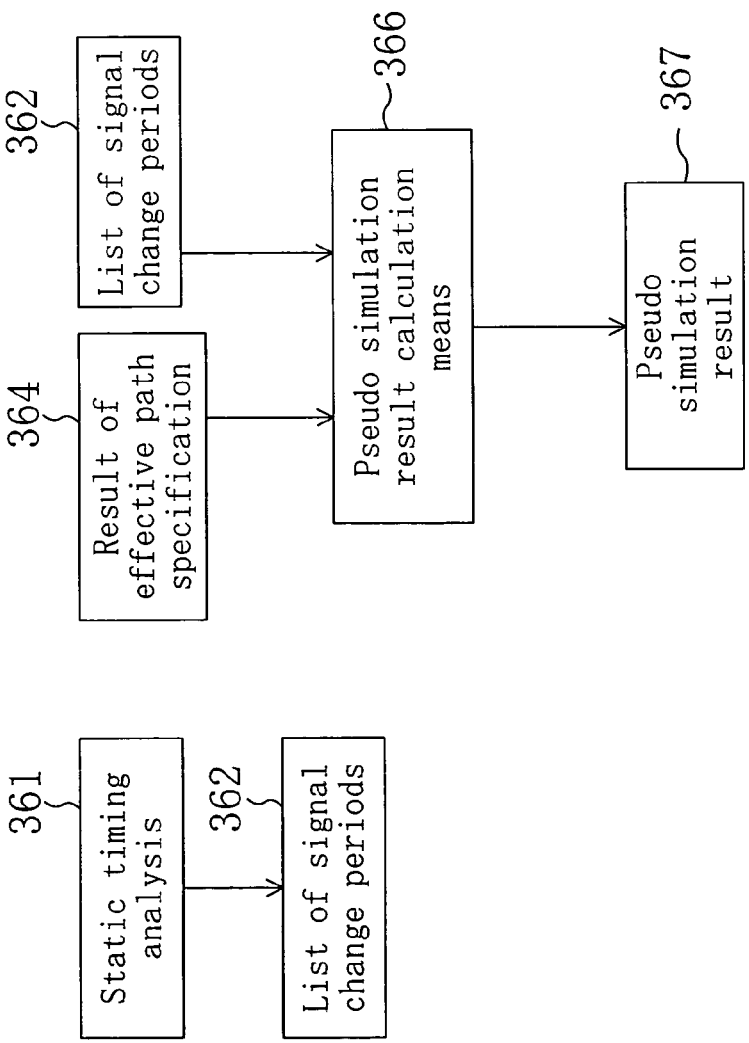
FIG. 38A
FIG. 38B
FIG. 38C

SEMICONDUCTOR INTEGRATED CIRCUIT VERIFICATION METHOD AND TEST PATTERN PREPARATION METHOD

CROSS-REFERENCE TO RELATED APPLICATION

This application is related to Japanese Patent Application No. 2003-411380 filed on Dec. 10, 2003, whose priority is claimed under 35 USC §119(a), the disclosure of which is incorporated herein by reference in its entirety.

BACKGROUND OF THE INVENTION

1. Field of the Invention

The present invention relates to semiconductor integrated circuit verification methods and test pattern preparation methods for verifying and testing semiconductor integrated circuits.

2. Conventional Technique

Before shipped as products, LSIs are tested whether their inner circuits function properly. Such a test is carried out by inputting a test pattern into the LSI using a test apparatus (i.e., an LSI tester). In order to perform the test in a stable manner, verification has to be performed sufficiently so that the test pattern becomes a test pattern in which variation in the LSI process, temperature, voltage and the like, and constraints of the test apparatus are considered.

There are two verification methods: dynamic logic verification and static logic verification. Dynamic logic verification is a method in which a circuit to be verified is made to operate and operation by each of the sections in the circuit is verified. Static logic verification is a method for verifying the total value of signal delay times in the entire signal paths to be checked. Of these logic verification techniques, the dynamic logic verification has been the mainstream approach. However, this method takes an enormous amount of processing time to verify a recent miniaturized integrated circuit with higher density. Therefore, statistic verification has been replacing dynamic verification.

Hereinafter, a conventional semiconductor integrated circuit verification method will be briefly described with reference to the accompanying drawings.

FIG. 46 is a view illustrating an ordinary library used in a typical conventional semiconductor integrated circuit verification method. FIG. 47 is a view illustrating an ordinary library used in a semiconductor integrated circuit verification method according to a first conventional example. FIG. 48 is an explanatory timing chart indicating the semiconductor integrated circuit verification method of the first conventional example.

The semiconductor integrated circuit verification method of the first conventional example, which is a verification method developed in consideration of constraints of a test apparatus, is described in Japanese Laid-Open Publication No. 11-142489. In this verification method, a test stabilization library 1007 such as shown in FIG. 47 is used instead of an ordinary library 1001 such as shown in FIG. 46. The test stabilization library 1007 includes a signal propagation delay buffer 1003 and a signal-propagation/transient-response-delay buffer 1005.

A shown in FIG. 48, an output signal, which is output from a semiconductor integrated circuit in response to an input signal, is in a transition state when the signal rises from the low level (hereinafter simply referred to as the "L level") to the high level (hereinafter simply referred to as the "H level") or falls from the H level to the L level. In the transition state, the signal is neither at the H level nor at the L level. This transition state, in which the signal is neither at the H level nor at the L level, includes a transition state in which the signal is when it rises or falls, a Z state (i.e., a high impedance state), and an intermediate (resistive) state between the H level and the L level.

A verification apparatus used in the first conventional example is furnished with a storage section for storing output-signal expected values derived from circuit information. The expected values are compared with measurement-system determination results, which are measurement results, by a dedicated verification tool, for example. However, if the comparison is performed when the output signal is at the Z level, the measurement of the signal becomes unstable, leading to an inaccurate test.

In the verification method of the first conventional example, an output IN1 from the signal propagation delay buffer 1003 changes from the L level to the H level and from the H level to the L level at the rising and falling times of the output signal, respectively. An output IN2 from the signal-propagation/transient-response-delay buffer 1005 changes from the L level to the H level or from the H level to the L level at the point in time when the voltage of the output signal reaches the H-level threshold voltage. This permits a strobe point to be set in a period of time other than the periods of time in which the output signal is in the Z state, thereby enabling an accurate test.

Japanese Laid-Open Publication No. 2001-235522 discloses a second conventional example which is a test pattern preparation method in which static timing analysis is used.

FIG. 49 is a flowchart schematically indicating the test pattern preparation method according to the second conventional example.

As shown in FIG. 49, this method indicates a method for preparing a test vector used in a verification method which includes statistic timing analysis.

First, a test-vector-preparation supporting section 1015 prepares a test-data-extraction-timing designating file 1017 which includes timing conditions. The test-vector-preparation supporting section 1015 also prepares a test-vector-timing designating file 1016.

Next, the test-data-extraction-timing designating file 1017 is input into a logic simulation section 1018. The logic simulation section 1018 then performs dynamic verification using the test-data-extraction-timing designating file 1017 and a test-vector generation program 1020, thereby preparing a final test vector 1021.

SUMMARY OF THE INVENTION

In the semiconductor integrated circuit verification method according to the first conventional example, the memory for storing the dedicated library is provided in the verification apparatus with the verification tool, and in addition, extra dynamic verification has to be carried out. Therefore, as integrated circuits have been miniaturized with an increased number of devices integrated thereon, the amount of data to be processed becomes enormous, which may cause the first conventional method to take a great deal of time to process the data.

Also, in the test pattern preparation method of the second conventional example, the dynamic verification in which delay information is used is necessary, and the designer has to input, to the test-vector-preparation supporting section 1015, offset time for the minimum and maximum delay times generated by static timing analysis. Therefore, in the case of a miniaturized integrated circuit with higher density, verification of the circuit may take a longer time.

It is therefore an object of the present invention to provide semiconductor integrated circuit verification methods in which, while increase in verification time is suppressed, stable tests are allowed to be carried out, and to provide methods for preparing test patterns used in the verification methods.

A first inventive semiconductor integrated circuit verification method is a semiconductor integrated circuit verification method in which operation verification is performed using a signal which is output from an integrated circuit to be verified according to a test pattern that has been input to the integrated circuit. The inventive method includes a step (a) in which an expected value comparison time, at which a value of the signal is compared with an operation expected value, is extracted using the operation expected value and a period of time in a test cycle in which the signal changes.

This method allows the operation verification of the integrated circuit to be performed without carrying out dynamic verification, which significantly shortens the amount of time required for the circuit operation verification as compared with conventional methods. This method is thus preferably applied to miniaturized integrated circuits having higher density. In addition, since the number of steps required for preparing a test pattern is reduced, the test pattern for stably testing the integrated circuit can be prepared with a lesser number of process steps as compared with conventional methods. This reduces the semiconductor integrated circuit fabrication costs including the development costs thereof. Furthermore, in the step (a), if the expected value comparison time is set so as not to be within the period of time in which the signal value is unstable, the integrated circuit can be tested stably.

The signal change period in the test cycle is obtained at least by timing verification of the integrated circuit. Then, the signal change period in the test cycle can be obtained using a commercial tool such as a STA tool.

The signal change period in the test cycle includes a signal changeability period in which a rise or fall time of the signal varies, and in the step (a), the expected value comparison time is set in a period of time other than the signal changeability period. Then, a test pattern in which variation is considered is prepared, thereby enabling a more reliable test.

The inventive method further includes, before the step (a), the step (b) of performing the timing verification under a plurality of delay conditions, thereby obtaining at least the signal change period in the test cycle. Then, the circuit operation verification can be performed with consideration given to variations caused by the various conditions. Accordingly, with the verification result, a more reliable test is performed.

In the step (a), the expected value comparison time is set in a period of time in which values of the signal obtained under the respective delay conditions are both equal to the operation expected value. Then, it is possible to prepare a test pattern which withstands various variations.

The method further includes a step (c) in which if the test cycle includes no period of time in which values of the signal obtained under the respective delay conditions are both equal to the operation expected value, the cycle is treated as a cycle in which no expected value comparison is possible. Then, it is possible to prepare a stable test pattern that can withstand any variations in the signal delay time caused due to various kinds of factors. By using this test pattern, an accurate test can be performed.

The test pattern is input from a test apparatus, and the method further includes the step (d) of determining whether or not the extraction of the expected value comparison time in the step (a) is performed within a range of measurement capability of the test apparatus. Then, measurement conditions or the like can be adjusted so that the extraction of the expected value comparison time is performed within the range of measurement capability of the test apparatus, thereby allowing the operation verification to be more accurate.

In the step (d), it is determined whether or not a delay time of the signal in the test cycle is within a delay constraint of the test apparatus. Then, the operation verification is performed more specifically and more accurately.

The inventive method further includes: before the step (a), the step (e) of obtaining a period of time required for the signal to change in level as a signal transition period; and after the step (e) and before the step (a), the step (f) of adding the signal transition period to the signal change period in the test cycle, thereby obtaining a combined signal change period, wherein in the extraction of the expected value comparison time in the step (a), the combined signal change period is used. Then, the expected value comparison time can be set so that no expected value comparison is performed in the signal transition period in which the signal becomes unstable, such as during a rise or fall time of the signal. Accordingly, it is possible to prepare a test pattern which enables the integrated circuit to be tested in a stable manner.

In the step (a), the expected value comparison time is not set at least within the signal transition period. Then, highly accurate verification result is achieved.

In the step (e), signal transition period calculation means calculates the signal transition period by using at least load capacity of the test apparatus as a parameter. Then, even if test apparatuses having different inner load capacities are used, the operation verification can be performed accurately.

The inventive method preferably further includes: the step (g) of obtaining load absence delay information on the signal, the information being received by the test apparatus when it is assumed that there is no load capacity in the test apparatus, and the step (h) of obtaining load presence delay information on the signal, the information being received by the test apparatus when there is load capacity in the test apparatus. In the step (e), the signal transition period calculation means preferably calculates the signal transition period using the load absence delay information and the load presence delay information.

In the step (e), signal transition period calculation means calculates the signal transition period by using, as a parameter, at least a frequency of the signal that propagates in the integrated circuit. Then, it is possible to perform the circuit operation verification in consideration of delay of the signal caused by the operation frequency of the integrated circuit.

For example, the inventive method further includes: before the step (e), the step (i) of performing simulation of the integrated circuit using a simulation apparatus, and a step (j) in which signal frequency extraction means extracts the frequency of the signal using at least result of the simulation, wherein in the step (e), the signal transition period calculation means calculates the signal transition period based on the frequency of the signal extracted in the step (j). This enables the above-mentioned circuit operation verification performed in consideration of the signal delay caused by the operation frequency of the integrated circuit. It should be noted that the signal transition period may be automatically calculated based on the frequency.

The inventive method further includes the step (k) of preparing a database where a condition, which affects the signal transition period, and the signal transition period obtained when the condition is used are stored, wherein in the step (f), the signal transition period retrieved from the database is added to the signal change period in the test cycle. Then, the circuit verification can be carried out in a shorter time as compared with cases in which the delay time is calculated using a tool or the like based on conditions for the circuit verification.

The extraction of the expected value comparison time in the step (a) is performed by grouping. Then, as compared with cases where no grouping is performed, the function of the test apparatus is used efficiently, thereby achieving a shorter test time. It is also possible to achieve test pattern verification and test pattern preparation which enable a highly accurate test, in which fault coverage is not reduced, while the number of steps required for preparing the test pattern is reduced. Accordingly, the number of masked potions is reduced, which makes it easier to extract expected value comparison times at which expected value comparison is performed stably.

The integrated circuit includes a terminal for outputting the signal in accordance with a clock signal asynchronous with a reference clock signal; the method further includes the step (i) of converting the signal output from the terminal into another signal, based on signal change in, and a period of, the reference clock signal; and the signal change period in the test cycle is calculated for the signal output from the terminal by using the another signal obtained in the step (i). Then, even if the integrated circuit operates based on a plurality of clock signals, expected value comparison is conducted stably, thereby permitting the circuit operation verification to be carried out more accurately.

The integrated circuit has a plurality of signal paths, and the method further includes, before the step (a), a step (m) in which a verification tool obtains a delay time in the signal change from result of dynamic verification of the integrated circuit, and then detects through which one of the signal paths the signal passes in each of cycles of the signal. Then, by combining the path detection result with the timing verification result, it is possible to use different delay times for the respective cycles to establish expected value comparison times. Furthermore, as a result of the path detection, output from unnecessary paths, through which the signal is not expected to pass, can be identified so as not to be compared with the expected value, for example.

The inventive method further includes: the step (n) of obtaining result of timing verification performed in an identical mode as the dynamic verification of the integrated circuit, the result including path information and the signal change period in the test cycle for each of the signal paths, and before the step (a), the step (o) of extracting an effective one of the paths based on the path information, the signal change period in the test cycle for each signal path, and result of the path detection obtained in the step (m). It is then possible to use different delay times for the respective cycles to establish expected value comparison times, which enables the circuit operation verification to be performed more accurately.

The result of the dynamic verification is obtained by performing the dynamic verification in a plurality of modes. Then, the accuracy of fault coverage in the circuit is increased to a higher degree as compared with cases in which dynamic verification result obtained in a single mode is used.

The inventive method further includes: the step (p) of obtaining result of dynamic verification of the integrated circuit at least in one mode; the step (q) of extracting an effective path by using the dynamic verification result; the step (r) of obtaining timing verification result including path information on the integrated circuit and the signal change period in the test cycle; and the step (s) of preparing, in a pseudo manner, result of dynamic verification in a mode different from the mode of the dynamic verification result obtained in the step (p), by using the timing verification result and result of the effective path extraction. Then, the amount of time which would be required to perform the dynamic verification in multiple modes is shortened, while circuit operation verification in which signal variations occurring in the multiple modes are considered is achieved, for example.

The inventive method further includes: the step (t) of obtaining result of dynamic verification of the integrated circuit, and the step (u) of confirming the sequence of transitions of the signal by using the dynamic verification result and the operation expected value. It is then possible to detect types of faults that cannot be detected just by performing a conventional test alone. For example, it is possible to identify a case in which a defective integrated circuit cannot be detected because the integrated circuit is tested on a cycle-by-cycle basis.

The inventive method further includes: the step (v) of obtaining result of dynamic verification of the integrated circuit, and the step (w) of confirming the number of transitions of the signal by using the dynamic verification result and the operation expected value. It is then possible to prepare a test pattern for detecting types of faults that cannot be detected just by performing a conventional test alone.

A second semiconductor integrated circuit verification method is a semiconductor integrated circuit verification method in which operation verification is performed using a signal which is output from an integrated circuit to be verified according to a test pattern that has been input to the integrated circuit. The inventive method includes: the step (a) of obtaining result of timing verification of the integrated circuit; the step (b) of obtaining a period of time required for the signal to change in level as a signal transition period; and the step (c) of adding the signal transition period to the timing verification result.

According to this method, it is possible to prevent the expected value comparison time from being established in the signal transition period in which the signal becomes unstable, such as during a rise or fall time of the signal. Thus, a more stable test pattern is prepared. In addition, the number times that the dynamic verification is performed is reduced as compared with conventional methods, which significantly shortens the amount of time required for the circuit operation verification.

A third semiconductor integrated circuit verification method is a semiconductor integrated circuit verification method in which operation verification is performed using a signal which is output from an integrated circuit to be verified according to a test pattern that has been input to the integrated circuit. The inventive method includes: the step (a) of obtaining result of dynamic verification of the integrated circuit, and the step (b) of confirming the sequence of transitions of the signal by using the dynamic verification result and an operation expected value of the signal for the test pattern.

This method makes it possible to identify a case in which a defective integrated circuit cannot be detected because the integrated circuit is tested on a cycle-by-cycle basis.

A fourth semiconductor integrated circuit verification method is a semiconductor integrated circuit verification method in which operation verification is performed using a signal which is output from an integrated circuit to be verified according to a test pattern that has been input to the integrated circuit. The inventive method includes: the step (a) of obtaining result of dynamic verification of the integrated circuit, and the step (b) of confirming the number of transitions of the signal by using the dynamic verification result and an operation expected value of the signal for the test pattern.

This method also enables the preparation of a test pattern which allows detection of types of faults that cannot be detected just by performing a conventional test alone.

An inventive test pattern preparation method is a test pattern preparation method in which a test pattern is input to verify operation of an integrated circuit and the test pattern is processed using a signal which is output according to the test pattern. The inventive method includes: the step (a) of processing the test pattern by using an operation expected value and a period of time in a test cycle in which the signal changes, the signal change period being obtained by timing verification of the integrated circuit.

According to this method, the test pattern can be masked or an expected value comparison time can be moved so that no expected value verification is performed in the change period in which the signal level varies, for example. Accordingly, a test pattern having a more stable expected value comparison time is prepared, thereby enabling a high-quality test.

Additionally, if it is found by the above-described semiconductor integrated circuit verification methods that there is a section(s) in which stable expected value comparison is not possible, the test pattern may be masked or the expected value comparison time may be moved so that the expected value comparison time is set in a section in which stable expected value comparison is possible. As a result, more accurate circuit operation verification is achieved.

EFFECTS OF THE INVENTION

According to the semiconductor integrated circuit verification methods and the test pattern preparation methods of the present invention, a test pattern is prepared based on a stable timing(s) with consideration given to variation in LSI process, temperature, voltage and the like and to constraints of the test apparatus. As a result, the accuracy of the test patterns is increased. Moreover, unlike in conventional methods, dynamic verification does not require a large number of steps in the inventive methods. The number of steps required for the test pattern preparation is thus reduced, which finally enables a high-quality test.

BRIEF DESCRIPTION OF THE DRAWINGS

FIG. 5 is a flowchart indicating a semiconductor integrated circuit verification method according to a second embodiment of the present invention.

FIG. 6 is a flowchart for explaining a semiconductor integrated circuit verification method according to a third embodiment of the present invention.

FIG. 22 indicates a database including various conditions and delay times used in a semiconductor integrated circuit verification method according to a ninth embodiment of the present invention.

FIG. 32 indicates result of path detection in the verification method of the twelfth embodiment.

FIG. 33 indicates result of path detection in a semiconductor integrated circuit verification method according to a thirteenth embodiment of the present invention.

FIG. 37 indicates delay times occurring when output signals from the circuit shown in FIG. 29 change in level in cases where there is no load and there is load.

FIGS. 38A through 38C indicate a semiconductor integrated circuit verification method and a test pattern preparation method according to a fourteenth embodiment of the present invention.

DESCRIPTION OF THE PREFERRED EMBODIMENTS

In semiconductor integrated circuit verification methods and test pattern preparation methods according to preferred embodiments of the present invention, whether a test pattern is appropriate or not is verified. And the verified test pattern (test data) is input from a test apparatus to a semiconductor integrated circuit, and then a signal output in response to the test pattern is detected by the test apparatus to test the semiconductor integrated circuit. In the following preferred embodiments, semiconductor integrated circuit verification methods, developed with consideration given to variation in LSI process, temperature, voltage and the like and to constraints of the test apparatus, will be described, and methods for processing test patterns used in those semiconductor integrated circuit verification methods will be also discussed.

First Embodiment

Figure 1:
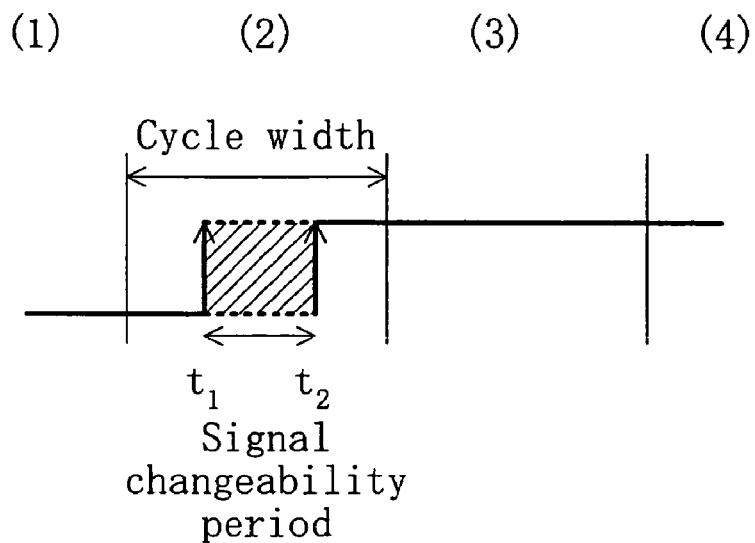
FIG. 1 is a view indicating an exemplary waveform result of logic verification.
Figure 2:
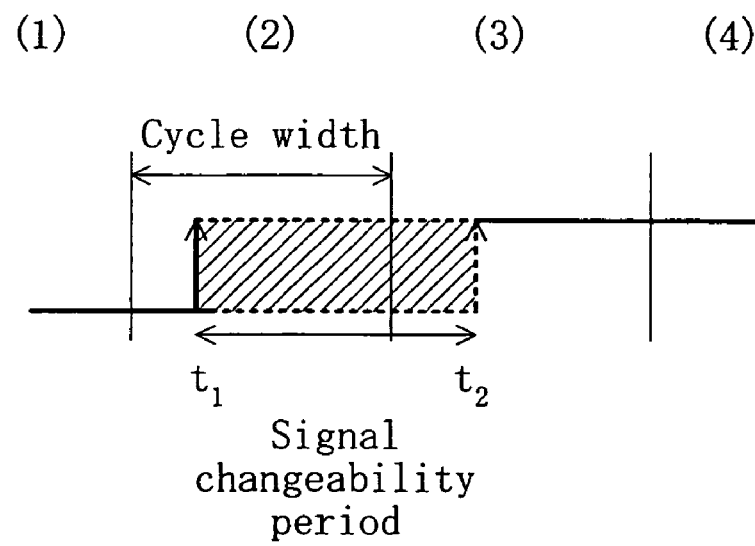
FIG. 2 is a view indicating another exemplary waveform result of logic verification.
Figure 3:
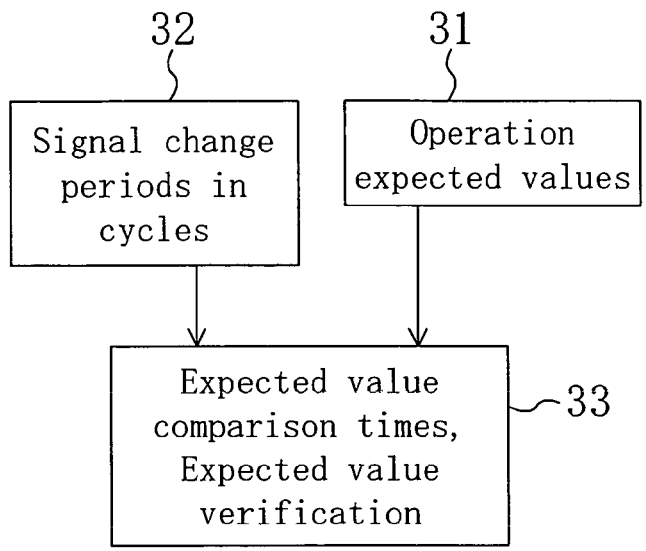
FIG. 3 is a flowchart indicating a semiconductor integrated circuit verification method according to a first embodiment of the present invention.
Figure 4:
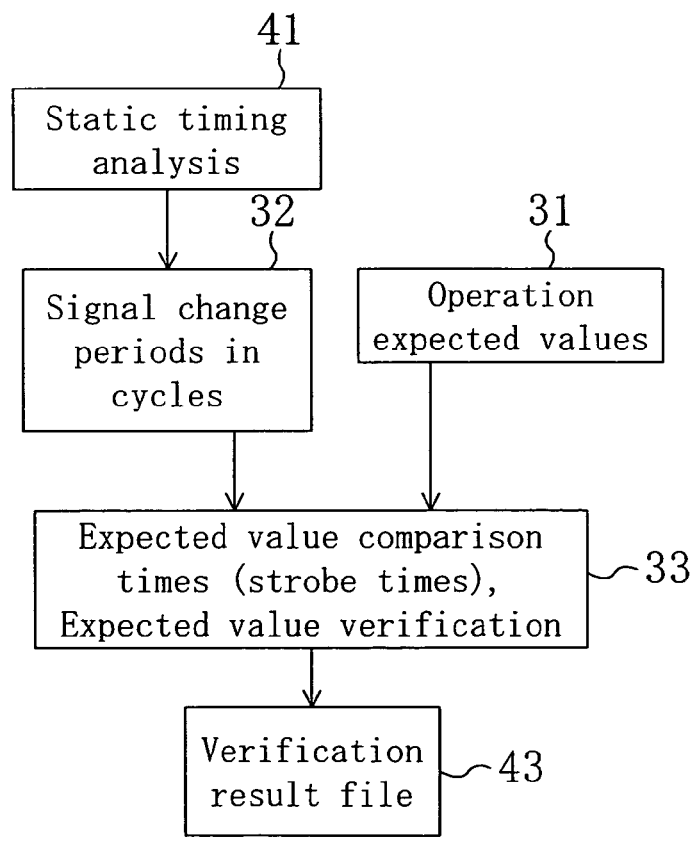
FIG. 4 is a flowchart indicating an example in which periods of time in which a signal changes are extracted using a verification tool in the semiconductor integrated circuit verification method of the first embodiment.

FIGS. 1 and 2 are views each illustrating an exemplary waveform result of logic verification. FIG. 3 is a flowchart indicating a semiconductor integrated circuit verification method according to a first embodiment of the present invention. FIG. 4 is a flowchart indicating an example, in which periods of time in which signals change are extracted using a verification tool, in the semiconductor integrated circuit verification method of this embodiment.

As shown in FIGS. 3 and 4, the semiconductor integrated circuit verification method of this embodiment is performed in the following procedure.

First, an operation expected value 31 in each of the cycles of an input clock is prepared. Those operation expected values 31 are obtained by, for example, RTL verification and stored in a storage device or the like. The cycle as used herein is a period equal to one period of the input clock. As the input clock, the operation clock of the circuit to be verified may be used, or a clock signal input from a test apparatus may be used. The operation expected values are values of an output signal, which are determined for the respective cycles while the clock is being input.

Next, signal change periods 32 in given cycles are prepared. The signal change periods 32 in the given cycles may be obtained from results of timing verification of the circuit to be verified. Alternatively, an actual device may be measured using the test apparatus, and from the measurement results, the signal change periods 32 in the given cycles may be extracted. The timing verification includes both cases performed by dynamic verification and by static timing analysis (STA). Of those cases, the case in which static timing analysis using a STA tool is performed as shown in FIG. 4 is particularly preferable, because the amount of time required for the verification can be shortened significantly.

In the respective embodiments of the present invention, "a signal change period in a (test) cycle" means a range of time in each (test) cycle in which the level of a signal changes, and information on that time range.

Next, as shown in FIGS. 3 and 4, extraction 33 of expected value comparison times is performed using the operation expected values 31 and the signal change periods 32 in the cycles. This extraction is carried out by a dedicated verification tool, for example. In the verification method of this embodiment, the expected value comparison times are established in the following manner so that the operation expected values 31 are correctly compared with measurement values of the circuit to be verified.

When a test pattern is input into the semiconductor integrated circuit to be verified, the time at which an output signal is produced varies due to variation in the LSI process, measurement temperature and an input signal and variation in power supply voltage or the like. Due to this, as shown in FIGS. 1 and 2, when the output signal rises from the L level to the H level, the rise time of the output signal falls between a time $t_1$, and a time $t_2$. The time $t_1$ is the rise time in the case where the output signal is produced with a minimum delay, and the time $t_2$ is the rise time in the case where the output signal is produced with a maximum delay. The interval from the time $t_1$ to the time $t_2$ will be hereinafter referred to as a "signal changeability period". If an expected value comparison time is established within the signal changeability period, expected value comparison cannot be made correctly.

Thus, in a case where the signal changeability period is shorter than the cycle width of the input clock as shown in FIG. 1, if the operation expected value in a cycle (2) is H, for example, the expected value comparison time is set after the time $t_2$ within the cycle (2) in the step in which the expected-value-comparison-time extraction 33 discussed above is performed.

In a case where the time $t_2$ moves to be present in a cycle (3) as shown in FIG. 2, if a strobe point is set within the cycle (2), the expected value comparison cannot be performed accurately. Therefore, there are cases in which no expected value comparison time is established in the cycle (2) so that no expected value comparison is conducted.

The expected-value-comparison-time extraction 33 described above is carried out by a CPU controlled by dedicated software, for example.

In cases where the expected value comparison times 33 have been established beforehand, expected value verification as to whether or not the values of an actually produced output signal match the operation expected values 31 may be performed in the step in which the expected-value-comparison-time extraction 33 is conducted. More specifically, the signal levels measured may be compared with the expected values so as to determine whether or not the measured values match the expected values. In view of this, the step in which the expected-value-comparison-time extraction is performed will be referred to as "expected-value comparison time/expected value verification" in the subsequent drawings including FIGS. 3 and 4 as well as in the following embodiments.

It should be noted that as shown in FIG. 4, after the expected-value-comparison-time extraction 33 is performed, a verification result file 43 may be output. The verification result file 43 may be used in computer-used analysis or the like.

In the semiconductor integrated circuit verification method of this embodiment, no expected value comparison is made in the period(s) in which the value of the output signal may vary due to variation in the process of the LSI to be verified, temperature at the time of the test, the voltage of the input signal, power supply voltage and the like. Thus, expected value comparison times which are more stable than conventional ones are established, resulting in an increase in the reliability of the test. Particularly, as shown in FIG. 4, when a STA tool is used, no dynamic verification is required, which reduces the number of test pattern preparation steps as compared with the conventional examples, thereby allowing the amount of time required for the verification to be decreased drastically. As a result, even in the case of a miniaturized integrated circuit having higher density, the circuit can be verified in a shorter time than before, thereby reducing fabrication costs and the length of the LSI design period.

Also, if the expected value comparison times extracted by the method of this embodiment are used, the expected value comparisons are not performed at times at which the signal value becomes unstable, which may eliminate waste in the test and shorten the test time.

It should be noted that in a semiconductor-integrated-circuit integration method according to this embodiment, the verification tool for performing the expected-value-comparison-time extraction 33 may be incorporated in the test apparatus or an external computer or the like. In the case of the verification tool incorporated in the test apparatus, the expected-value-comparison-time extraction 33 may be conducted within the test apparatus itself. On the other hand, when the verification tool is incorporated in the external computer or the like, the amount of time in which the test apparatus whose running costs are high is used is shortened, which leads to reduction in the fabrication costs of the semiconductor integrated circuit.

In this embodiment, the exemplary case, in which the time $t_1$ is the time at which the delay is minimum, while the time $t_2$ is the time at which the delay is maximum, has been described. However, the times $t_1$ and $t_2$ may be any times so long as signal level changes occur with different delays at those times.

Second Embodiment

FIG. 5 is a flowchart indicating a semiconductor integrated circuit verification method according to a second embodiment of the present invention.

In the verification method of this embodiment, a variation range, in which a signal change period varies due to variation in LSI process, temperature at the time of measurement, power supply voltage and the like, is used as a condition for expected value verification.

As shown in FIG. 5, the semiconductor integrated circuit verification method of this embodiment is performed in the following procedure.

First, an output signal change period 51 under a minimum delay condition (hereinafter referred to as a "MIN delay condition") is obtained for each of the cycles of an input clock. The MIN delay condition is determined considering variation in LSI process, temperature, voltage and the like, and under the MIN delay condition, an output signal is produced at the earliest time such that the delay of the output signal in the circuit to be verified is minimum. The output signal change period 51 under the MIN delay condition may be obtained by, for example, inputting information on variation occurring in the circuit to be verified into a STA tool. Alternatively, the output signal change period 51 may be obtained from results of measurement of the circuit to be verified.

Next, an output signal change period 52 under a maximum delay condition (hereinafter referred to as a "MAX delay condition") is obtained for each cycle of the input clock. The MAX delay condition is determined considering variation in the LSI process, temperature at the time of measurement, power supply voltage and the like, and under the MAX delay condition, an output signal is produced at the latest time, such that the delay of the output signal in the circuit to be verified is maximum. Like the output signal change period under the MIN delay condition, the output signal change period 52 under the MAX delay condition may be obtained by inputting information on the variation into the STA tool, for example. It should be noted that it is possible to omit the step of obtaining the output signal change period 51 under the MIN delay condition, by obtaining the output signal change period 52 under the MAX delay condition.

Next, operation expected values 53 are prepared. The operation expected values 53 are obtained by RTL verification, for example.

Then, extraction of expected value comparison times or expected value verification 54 is performed. In this step, if the expected value comparison times have been established in advance, the expected value verification as to whether or not the values of an actually produced output signal match the operation expected values 54 is performed.

If the expected value comparison times have not been established, an expected value comparison time is established in each of selected cycles. The expected comparison time is set within a period of time in which the signal value in the output signal change period 51 obtained under the MIN delay condition and the signal value in the output signal change period 52 obtained under the MAX delay condition are both equal to the expected value in that selected cycle.

In this manner, by covering all of the delay variations expected to occur during the verification of the integrated circuit, stable strobes that withstand those variations are determined and a stable test pattern is prepared. Also, as in the first embodiment, the integrated circuit is verified without using dynamic verification, allowing a reduction in the verification time as well as an increase in the quality of the test in which the test pattern obtained by the verification is used. Consequently, the development period of the semiconductor integrated circuit is shortened, which finally reduces the overall fabrication costs including the development costs.

Discussed in the foregoing description is the exemplary case, in which the extraction of the expected value comparison times is performed using the output signal change periods 51 obtained under the MIN delay condition and the output signal change periods 52 obtained under the MAX delay condition. Nevertheless, the delay conditions are not limited to the MIN and MAX delay conditions, and the extraction of the expected value comparison times may be performed using output signal change periods obtained under other multiple delay conditions. In that case, since those other multiple delay conditions are covered, it is also possible to determine more stable strobes and then prepare a stable test pattern, as compared with cases in which only a single delay condition is used.

Third Embodiment

Figure 7:
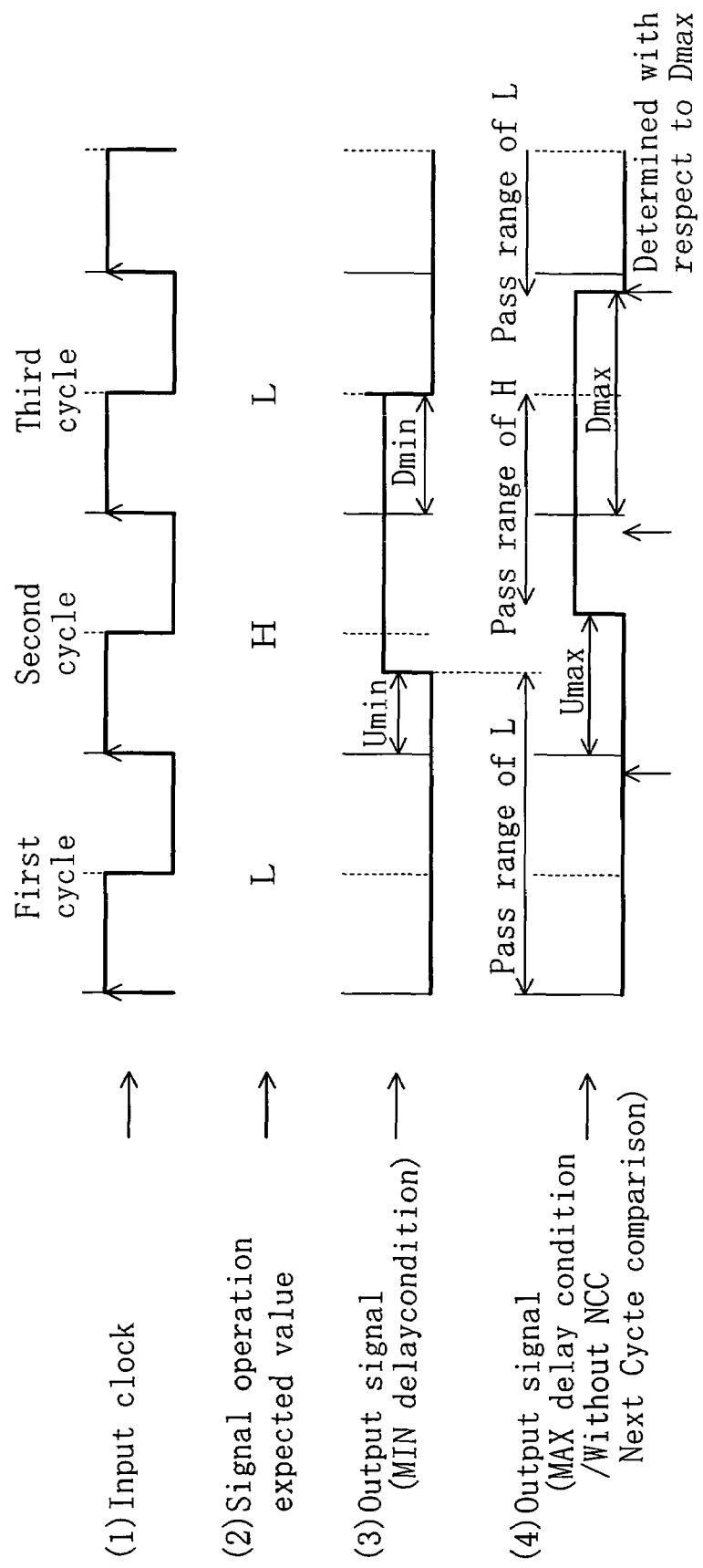
FIG. 7 is a timing chart indicating specific examples, according to the third embodiment, of an input clock, operation expected values of an output signal, and output signals respectively obtained under a MIN delay condition and a MAX delay condition in a case in which there is no NCC.
Figure 8:
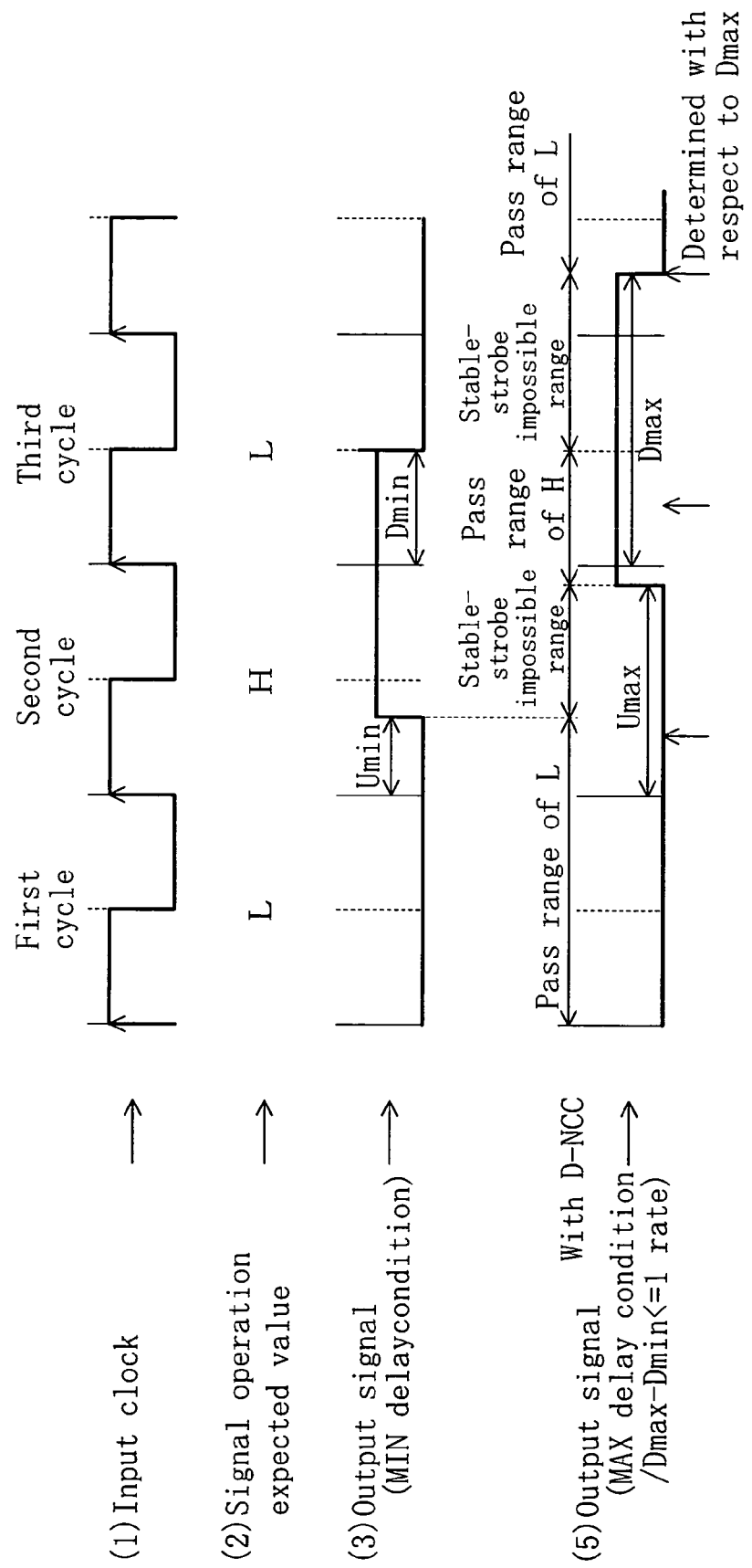
FIG. 8 is a timing chart indicating specific examples, according to the third embodiment, of an input clock, operation expected values of an output signal, and output signals respectively obtained under a MIN delay condition and a MAX delay condition in a case in which there is NCC.
Figure 9:
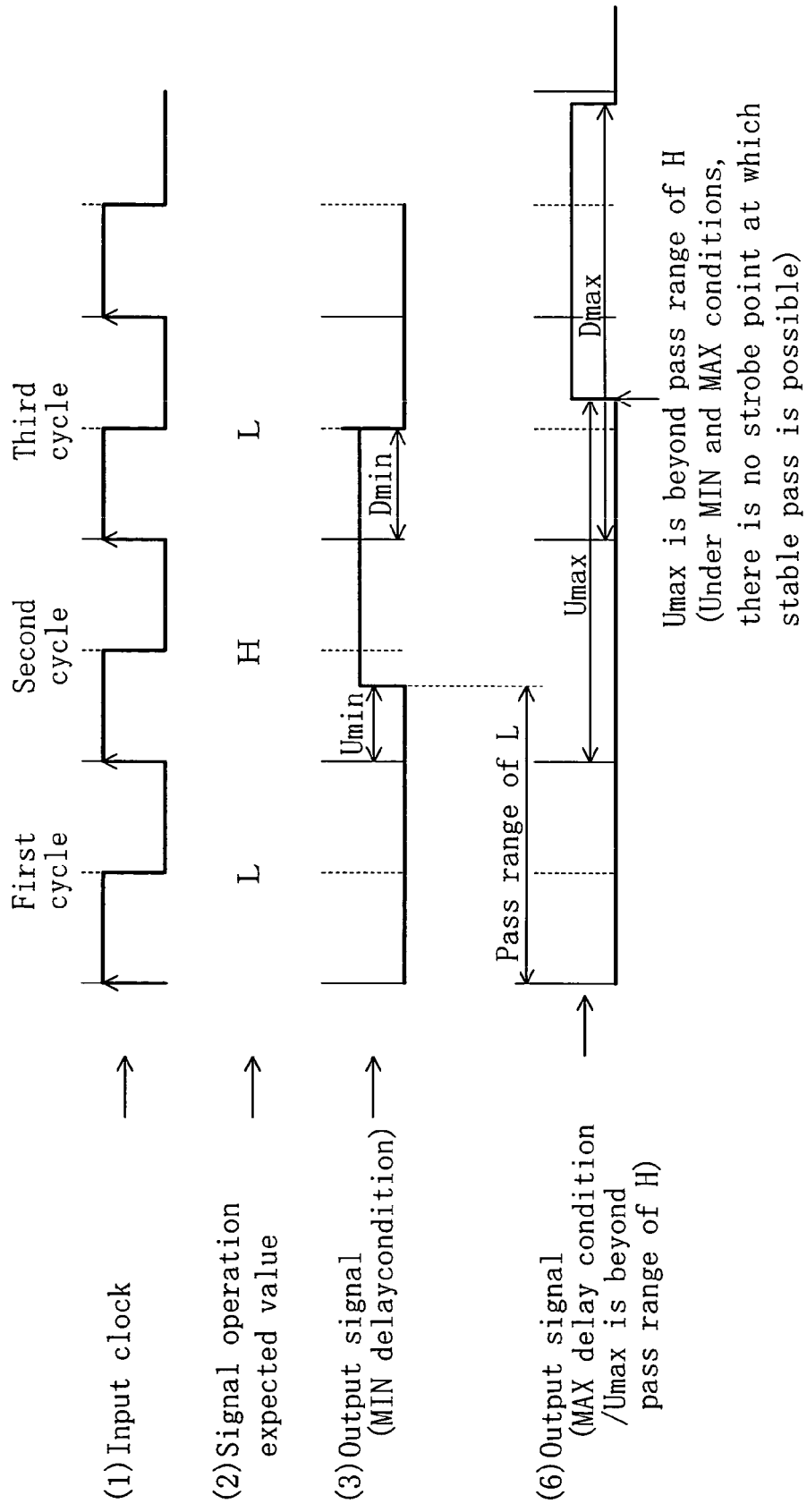
FIG. 9 is a timing chart indicating specific examples, according to the third embodiment, of an input clock, operation expected values of an output signal, and output signals respectively obtained under a MIN delay condition and a MAX delay condition in a case in which there are no stable expected value comparison times.

FIG. 6 is a flowchart for explaining a semiconductor integrated circuit verification method according to a third embodiment of the present invention. FIGS. 7, 8 and 9 are timing charts indicating specific examples of an input clock, operation expected values of output signals, and output signals obtained under different MIN delay conditions and MAX delay conditions.

The semiconductor integrated circuit verification method of the third embodiment is a method in which signal delay states obtained by timing verification and operation expected values are used.

As shown in FIG. 6, in the verification method of this embodiment, information on a signal state 61 under the MIN delay condition is obtained first. Information on a signal state 62 under the MAX delay condition is then obtained. Subsequently, operation expected values 63 are obtained. Next, by using the signal state 61 under the MIN delay condition, the signal state 62 under the MAX delay condition, and the operation expected values 63, a computer or the like, in which a verification tool is incorporated, extracts expected value comparison times or performs expected value verification 64.

In the step of the expected-value-comparison-time extraction, if the expected value comparison times have been established beforehand, the expected value verification as to whether or not the values of an actual output signal match the expected values may be performed. If the expected value comparison times have not been established, the expected value comparison times are extracted in this step.

This embodiment is characterized in that the setting of the expected value comparison times or the expected value verification is performed with consideration given to transitions made by the output signals produced under the MIN and MAX delay conditions, respectively. The output signal transitions mean signal value changes, such as a rise from the L level to the H level or a fall from the H level to the L level, for example. The signal values include "H", "L", "unfixed" (which means that the signal value is unknown) and the like. The signal strength may be indicated by "a normal level", "the Z level", that is, the disconnection state (high impedance), "the middle state (resistive) therebetween" or the like.

Next, with reference to FIGS. 7 through 9, three specific examples, in which expected value comparison times are extracted using signal states obtained by timing verification, will be discussed.

First, in the example shown in FIG. 7, the operation expected values of an output signal in the first through third cycles of an input clock are L, H, and L, respectively.

In the transition state of an output signal produced under the MIN delay condition, Umin in FIG. 7 indicates a period of time in which the signal rises from the L level to the H level, while Dmin shown in FIG. 7 indicates a period of time in which the signal falls from the H level to the L level.

Also, in the transition state of an output signal under the MAX delay condition, Umax in FIG. 7 indicates a period of time in which the signal rises from the L level to the H level, while Dmax indicates a period of time in which the signal falls from the H level to the L level. Particularly under the MAX delay condition, a long delay may arise depending on the configuration of the circuit, which may cause the signal change periods to extend beyond the corresponding cycles. This phenomenon is referred to as "NCC (next cycle comparison)". In the exemplary case that FIG. 7 indicates, no NCC occurs.

In this case, the expected value comparison times are set in the periods of time in which the output signals produced under the MIN and MAX delay conditions, respectively, are both equal in value to the corresponding operation expected values. Then, expected value comparison can be carried out stably even in cases where the rise and fall times of an actually produced output signal vary.

More specifically, if the expected value comparison times are set in time ranges indicated by the double-headed arrows of "a pass range of L" and "a pass range of H" shown in FIG. 7, expected value comparison can be stably performed in each of the first through third cycles. In the example of FIG. 7, an expected value comparison time is set to the falling edge of the signal, that is, Dmax, and from Dmax, other expected value comparison times are established for the respective cycles of the input clock, thereby enabling expected value comparison to be made stably in each of the first through third cycles. In this example, the comparison is performed with the expected value at Dmax being at the L level. Also, although in this example, only the first through third cycles are exemplary discussed, the expected value comparison may be conducted in all of the cycles at times established in the respective cycles in accordance with the same timing. For example, the expected value comparison times in all of the cycles may be established with respect to the fall time Dmax of the output signal obtained under the MAX delay condition. Considering that the number of timings which can be set in the test apparatus is limited and that it takes a time to input these settings into the test apparatus, it is preferable that the expected value comparison times in the respective cycles be set with respect to the same timing. Nevertheless, if there is a cycle(s) in which the expected value comparison cannot be conducted stably and that cycle(s) is important for the test, the time at which the expected value comparison is performed in that cycle(s) may be changed.

Next, FIG. 8 illustrates waveforms of signals obtained in a case where relationship between Dmin under the MIN delay condition and Dmax under the MAX delay condition is (Dmax−Dmin)<1 rate, wherein 1 rate is a period of an input clock. FIG. 8 indicates a case in which the fall time Dmax at which the output signal obtained under the MAX delay condition falls from the H level to the L level extends beyond the cycle width, such that the signal level changes in the next cycle (i.e., the fourth cycle).

In this case, expected value comparison times are set within periods of time in which the output signals produced under the MIN and MAX delay conditions, respectively, are both equal in value to the corresponding operation expected values. Then, expected value comparison can be carried out stably even in cases where the rise and fall times of an actually produced output signal vary. Periods of time in which the output signal level under the MIN delay condition differs from the output signal level under the MAX delay condition are set as "stable-strobe impossible ranges", and no expected value comparison times are set within those periods.

More specifically, if the expected value comparison times are set within time ranges indicated by the double-headed arrows of "a pass range of L" and "a pass range of H" shown in FIG. 8, expected value comparison can be stably performed in each of the first through third cycles. In the example of FIG. 8, by setting the expected value comparison times with respect to Dmax for the respective cycles of the input clock, expected value comparison can be stably performed in each of the first through third cycles.

Next, FIG. 9 illustrates waveforms of signals obtained in a case where relationship between Dmin obtained under the MIN delay condition and Dmax obtained under the MAX delay condition is (Umax−1 rate)<Dmin. In this example, the width of the time period Umax in which the output signal obtained under the MAX delay condition rises from the L level to the H level is larger than the width of the time period Dmin in which 15 the output signal obtained under the MIN delay condition falls from the H level to the L level. In this case, comparison of "H", which is the second cycle's expected value, cannot be performed stably at any times. In that case, some measures are taken: for example, the comparison of the second cycle's expected value "H" is performed at a time determined with respect to a different timing. Then, the expected value comparison is stably performed, even if the delay time of an output signal actually produced from the integrated circuit varies. "D-NCC" shown in FIG. 8 indicates NCC of the falling signal.

As described above, in the verification method of this embodiment, operation expected values, and information, obtained from timing verification, on at what times and how signals make transitions are used to extract expected value comparison times or to perform expected value verification as to whether or not the values of an actually produced output signal match the expected values, if the expected value comparison times have been established beforehand. Therefore, according to the verification method of this embodiment, stable strobes which withstand variations are determined and a stable test pattern is prepared.

Fourth Embodiment

Figure 10:
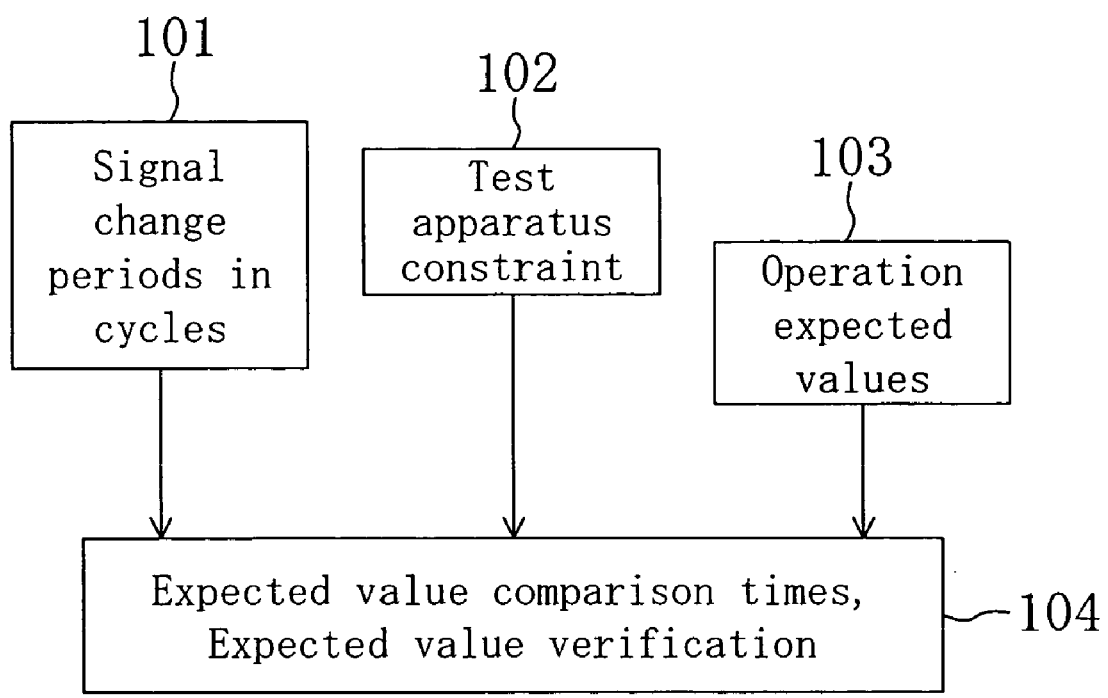
FIG. 10 is a flowchart for explaining a semiconductor integrated circuit verification method according to a fourth embodiment of the present invention.
Figure 11:
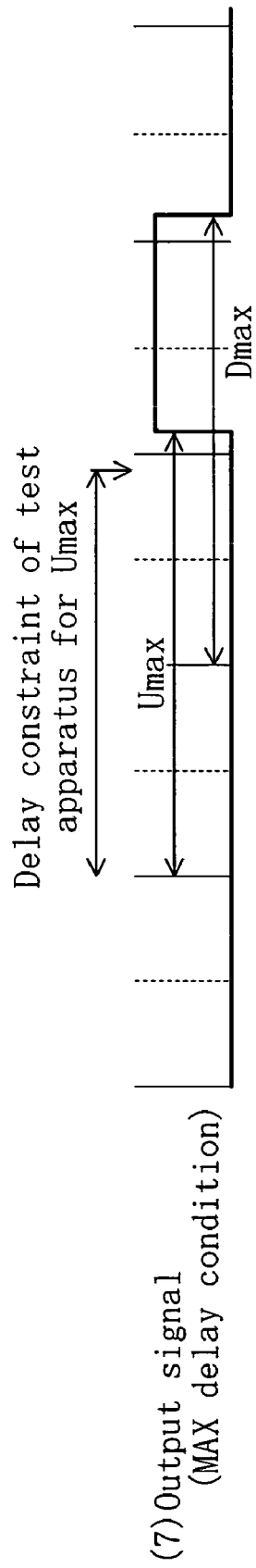
FIG. 11 is a timing chart indicating an output signal obtained under a MAX delay condition and a constraint of a test apparatus in the fourth embodiment of the present invention.

FIG. 10 is a flowchart for explaining a semiconductor integrated circuit verification method according to a fourth embodiment of the present invention. FIG. 11 is a timing chart indicating an output signal obtained under a MAX delay condition and a constraint of a test apparatus.

It is not possible to input all types of test patterns into the test apparatus, and there are constraints. If a test pattern which is beyond the range of constraints is input, the test may not be conducted correctly or the test apparatus may not accept the test pattern. As the semiconductor integrated circuit verification method of this embodiment, a method for verifying expected value comparison times and expected values for a test pattern using constraints of a test apparatus will be described.

As shown in FIG. 10, in the semiconductor integrated circuit verification method of this embodiment, signal change periods 101 in test cycles are obtained and then input into a computer or the like into which a verification tool is incorporated (hereinafter which will be simply referred to as a "computer or the like".) Constraints 102 of a test apparatus are also input into the computer or the like. Operation expected values 103 are then obtained and input into the computer or the like. Next, the computer or the like extracts expected value comparison times or performs expected value verification 104. The signal change periods 101 in the cycles are obtained by timing verification such as discussed in the first through third embodiments.

If the output signal is produced with a delay equal to or greater than a predetermined value, the test apparatus cannot carry out measurements. The test apparatus constraints 102 include the allowable range of signals that the test apparatus can measure, and other items.

In performing the expected-value-comparison-time extraction, the signal change periods 101 in the test cycles, the test apparatus constraints 102 and the operation expected values 103 are used so that not only consideration from the viewpoint of the test-cycle signal change periods 101 is given, but also whether or not the test apparatus constraints 102 are satisfied is checked. In the final stage of this step, the expected value comparison times are extracted, or if the expected value comparison times have been established beforehand, expected value verification as to whether or not the values of an actually output signal match the expected values may be performed.

For instance, in a case where the output signal obtained under the MAX delay condition exhibits a waveform such as shown in FIG. 11, a delay constraint of the test apparatus ends at the time indicated by the arrow. However, the actual output signal waveform rises from the L level to the H level at a point in time which is beyond this constraint. In that case, the test apparatus constraint is not satisfied, resulting in an inaccurate test. Therefore, as will be described later, if there is a cycle(s) in which the test apparatus constraint is not satisfied, the test pattern is processed so that no expected value comparison is performed in such a cycle(s) so as to prevent incorrect expected value comparison results from being included, thereby increasing the reliability of the circuit verification. Particularly when a semiconductor integrated circuit operates at higher speed, delay with respect to the clock period is increased. The verification method of this embodiment is thus applicable more preferably to semiconductor integrated circuits which operate at high speed.

As described above, according to the verification method of the fourth embodiment, the test pattern can be verified with consideration given to the test apparatus constraints, which allows verification in which the test apparatus constraints are taken into account.

Fifth Embodiment

Figure 12:
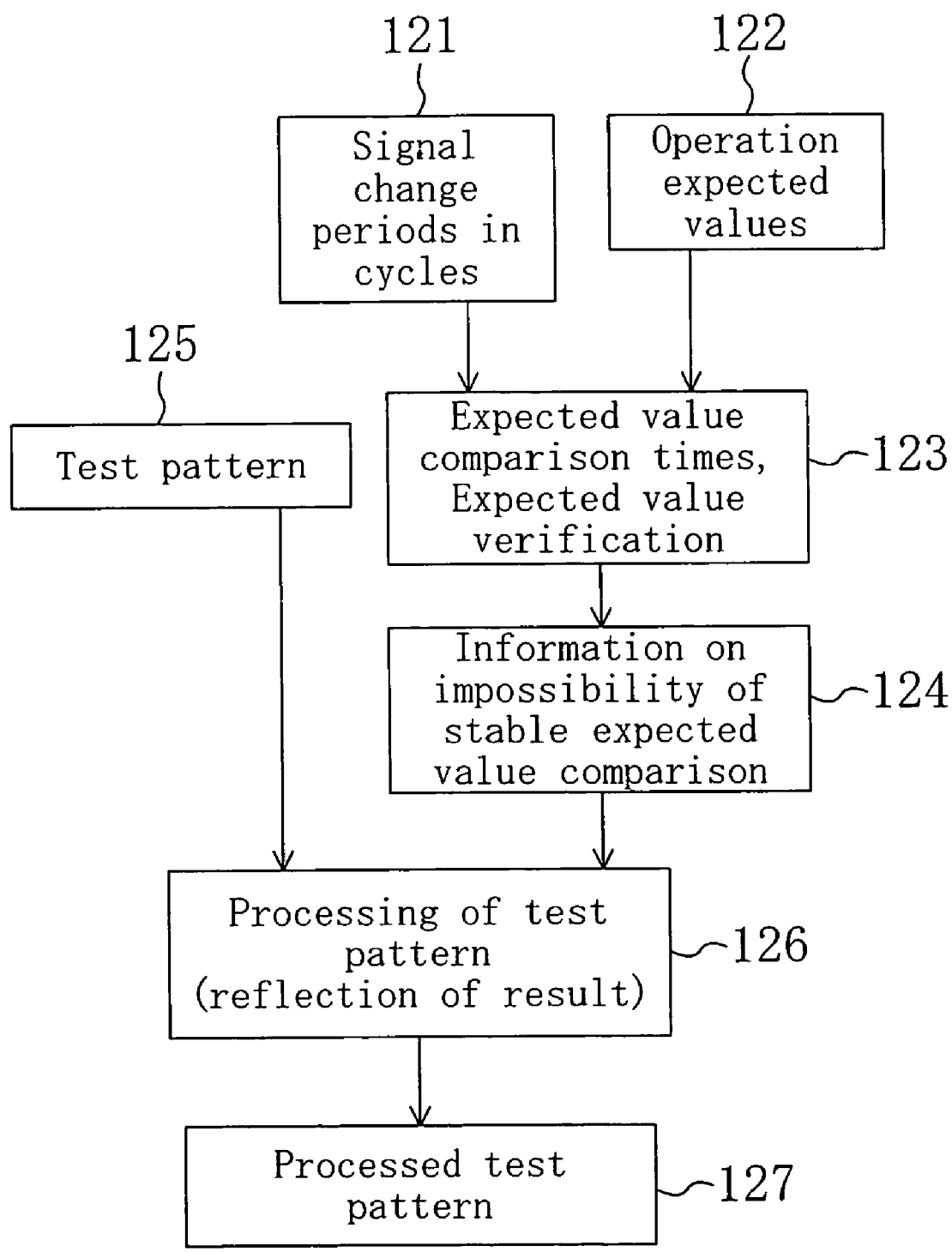
FIG. 12 is a flowchart for explaining a test pattern preparation method according to a fifth embodiment of the present invention.
Figure 13:
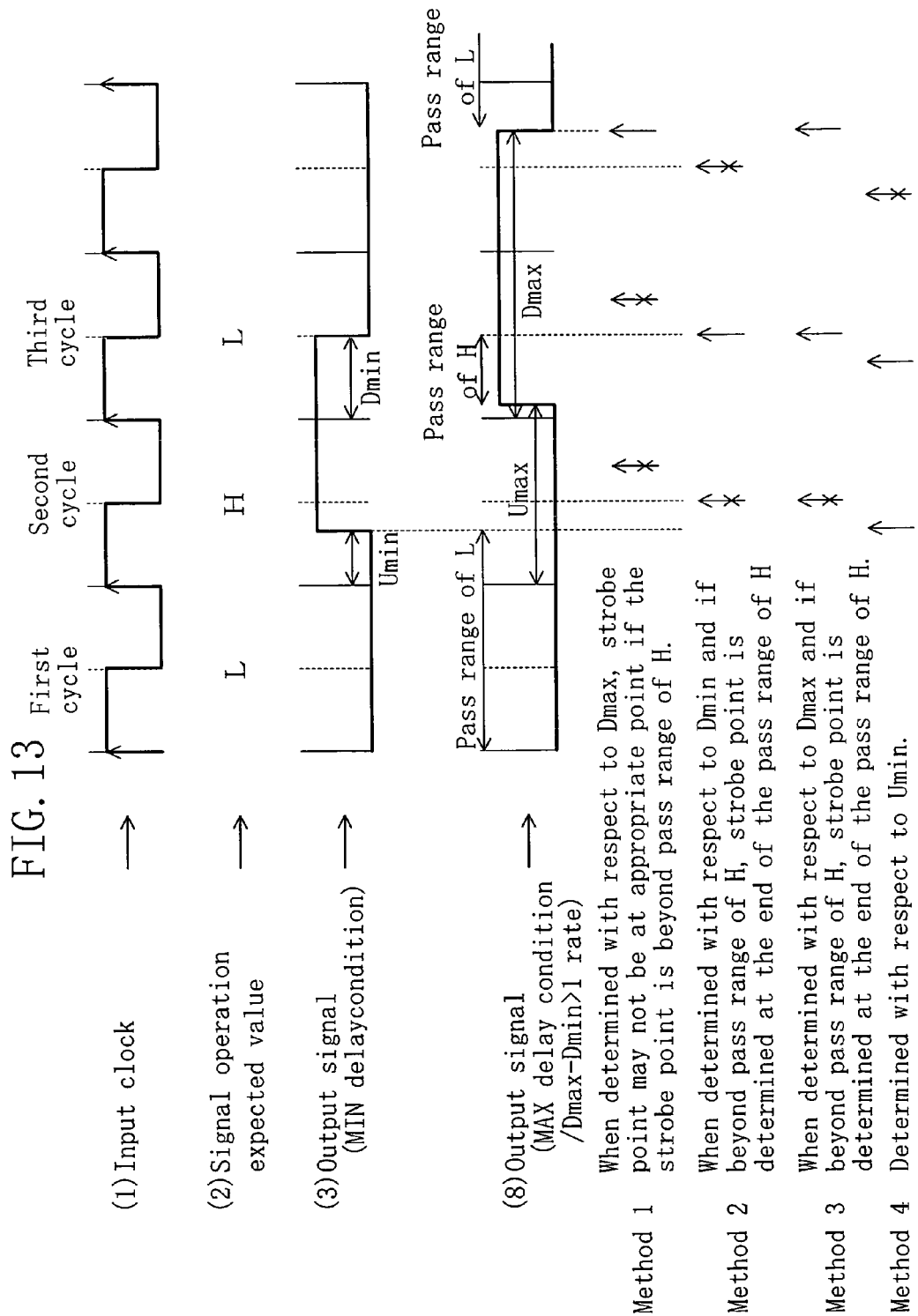
FIG. 13 is a timing chart indicating specific examples of an input clock, operation expected values of an output signal, and output signals obtained under MIN and MAX delay conditions, respectively, in the fifth embodiment of the present invention.

FIG. 12 is a flowchart for explaining a test pattern preparation method according to a fifth embodiment of the present invention. FIG. 13 is a timing chart indicating specific examples of an input clock, operation expected values of an output signal, and output signals obtained under MIN and MAX delay conditions, respectively.

In the verification methods described in the first through fourth embodiments, expected value comparison times are extracted using signal change periods in test cycles and operation expected values, or in a case where the expected value comparison times have been established in advance, expected value verification as to whether or not the values of an actually produced output signal match the expected values is performed. As a result of the extraction or verification, if it is found that there is a cycle(s) in which stable expected value comparison cannot be conducted, the test pattern needs to be processed so that no expected value comparison will be performed in such a cycle(s). Hereinafter, it will be described how to process a test pattern based on information on impossibility of stable expected value comparison, obtained by expected value verification.

As shown specifically in FIG. 12, signal change periods 121 in test cycles, obtained by a STA tool or the like, and operation expected values 122 are input to a verification tool or the like, as in the first through fourth embodiments, to extract expected value comparison times or perform expected value verification 123. In this step, if the expected value comparison times have been set in advance, expected value verification as to whether or not the values of an actually produced output signal match the expected values is conducted.

As a result of the extraction of the expected value comparison times, if the test apparatus or the like determines that there is a cycle(s) in which stable expected value comparison cannot be performed, information 124 on impossibility of stable expected value comparison is generated for that cycle(s). This step and the expected value verification step are realized by controlling the test apparatus or a computer by using a verification tool, which is software.

Subsequently, based on the information 124 on impossibility of stable expected value comparison, processing 126 of an original test pattern 125 is performed to generate a processed test pattern 127.

Next, the above-mentioned method will be described with reference to the specific waveforms shown in FIG. 13.

FIG. 13 indicates an example in which in the output signal obtained under the MAX delay condition, the rise time Umax at which the signal rises from the L level to the H level and the fall time Dmax at which the signal falls from the H level to the L level are both delayed behind the second cycle of the input clock and in which the expression, Dmax−Dmin>1 rate, holds. In this case, as shown in the "method 1" in FIG. 13, if expected value comparison times are determined with respect to Dmax, expected value comparison for the first cycle's expected value "L" and the second cycle's expected value "H" cannot be performed under the MIN delay condition (see crosses shown in FIG. 13.) Also, as indicated by the method 2 shown in FIG. 13, if expected value comparison times are determined with respect to Dmin, expected value comparison for the first cycle's expected value "L" cannot be performed under the MIN delay condition and expected value comparison for the third cycle's expected value "L" cannot also be performed under the MAX delay condition (see crosses in FIG. 13.) As in this case, when the expected value comparison cannot be performed stably in all of the cycles at the respective expected value comparison times determined with respect to a single timing, such a cycle(s) in which expected value comparison is impossible is masked, or other process is performed. Alternatively, as shown in the method 3, only the expected value comparison time for the third cycle's expected value "L" may be determined with respect to Dmax. In this case, the expected value comparison times in all of the cycles are not set with respect to a single timing, but established based on multiple timings. Moreover, the expected value comparison times may be determined with respect to Umin, as indicated by the method 4.

The expected value comparison times in this example may be determined based not only on Dmax and Dmin but also on Umax and Umin. In that case, expected value comparison is also performed stably by masking cycles in which no expected value comparison is possible, by changing expected value comparison times in some cycles, if necessary, or by performing other process.

As the LSIs have been increasingly miniaturized recently, there are cases in which stable expected value comparison times which correspond to variation in delay cannot be set with respect to a single timing (i.e., at the same point in each cycle.) In this case, the test pattern needs to be processed so that cycles in which test pattern expected value comparison cannot be stably performed are masked or that the expected value comparison is performed at a suitable time for the respective cycle so as to prevent a decrease in fault coverage. According to the test pattern processing method of this embodiment, even in verification of a miniaturized LSI, stable strobes that correspond to variation are determined and a stable test pattern is prepared, thereby allowing an increase in the accuracy of the test pattern as well as a decrease in the number of steps for preparing the test pattern. Accordingly, the use of the test pattern prepared according to the above-mentioned method increases the reliability of the test of the semiconductor integrated circuit.

Sixth Embodiment

Figure 14:
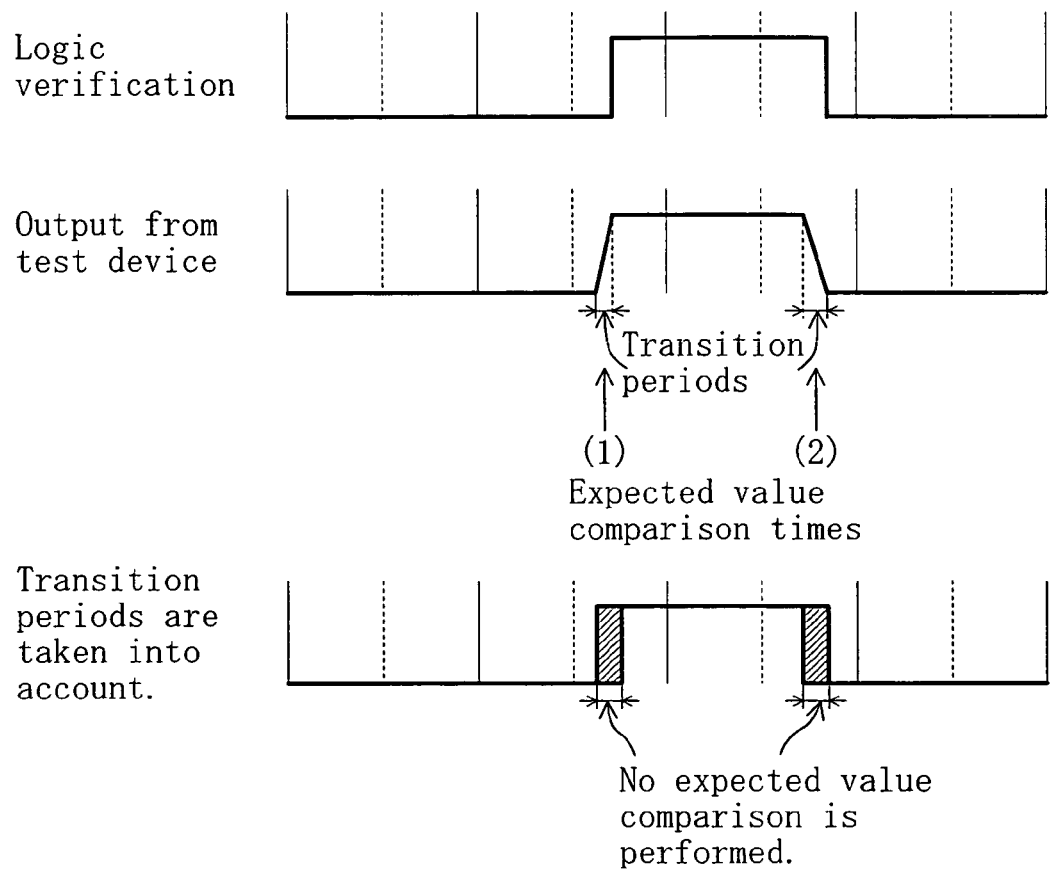
FIG. 14 is a timing chart indicating output waveforms from a test apparatus.
Figure 15:
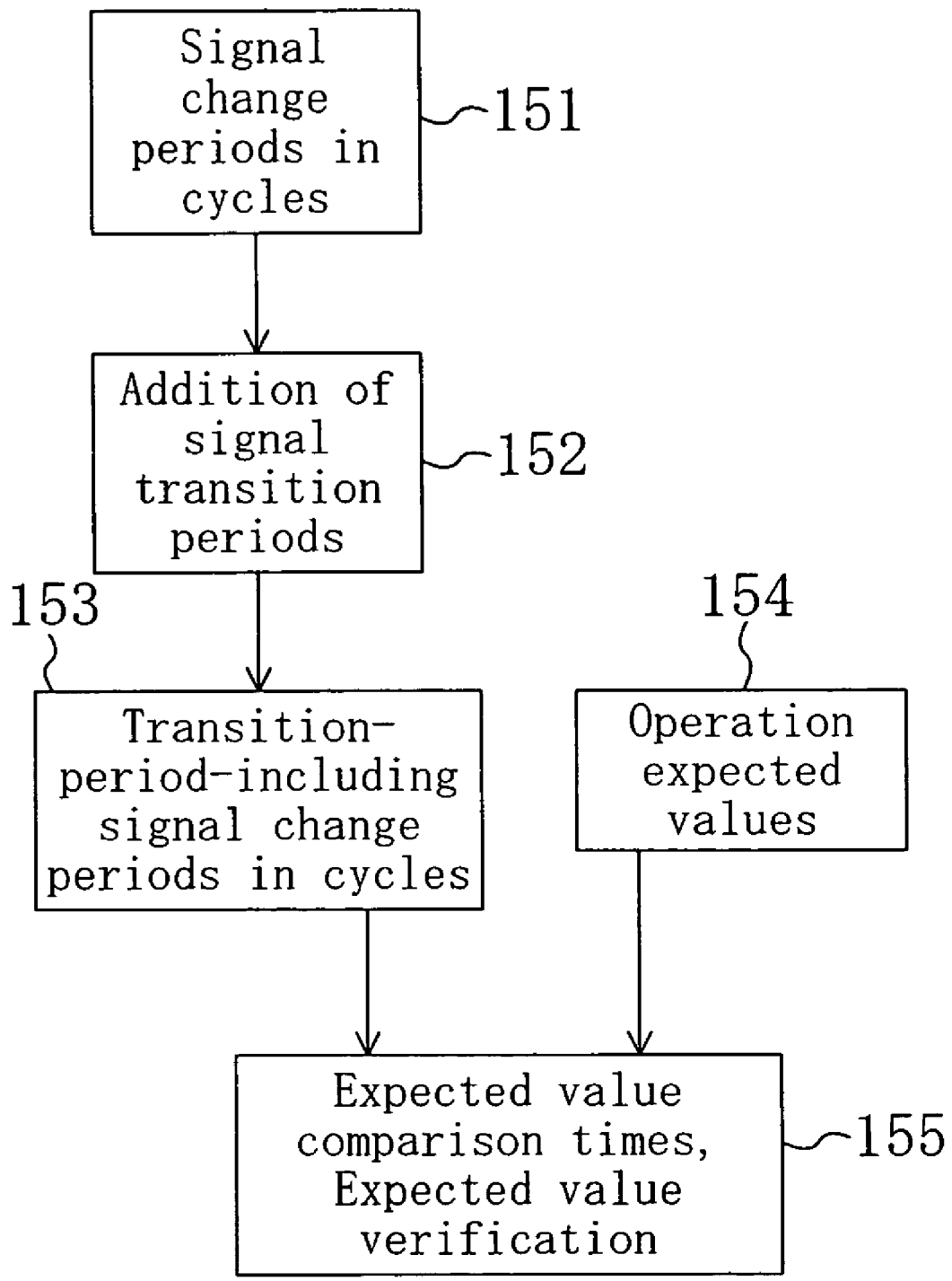
FIG. 15 is a flowchart for explaining a semiconductor integrated circuit verification method according to a sixth embodiment of the present invention.
Figure 16:
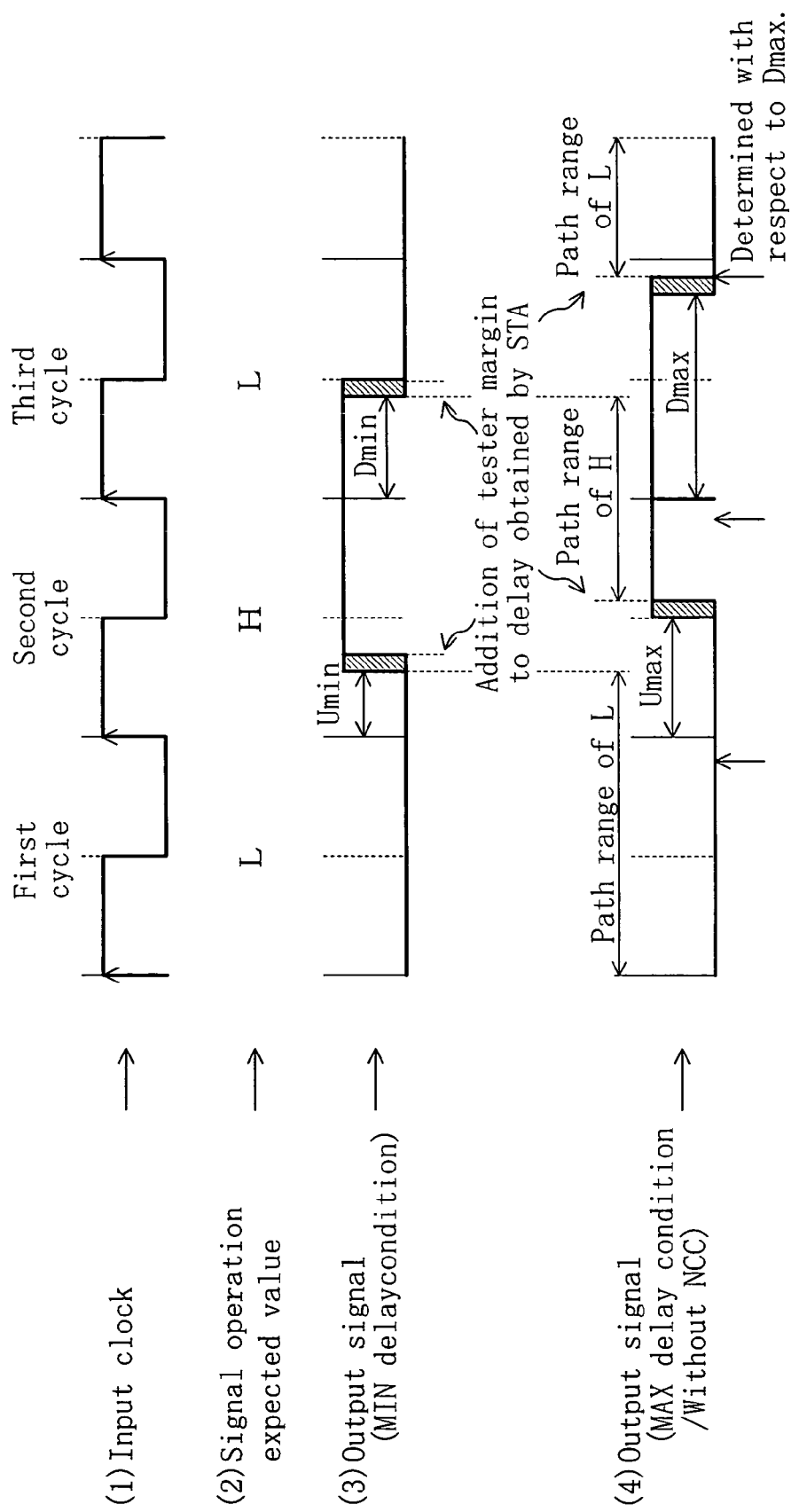
FIG. 16 is a timing chart indicating specific examples of an input clock, operation expected values of an output signal, and output signals obtained under MIN and MAX delay conditions, respectively, in the sixth embodiment of the present invention.

FIG. 14 is a timing chart indicating output waveforms from a test apparatus. FIG. 15 is a flowchart for explaining a semiconductor integrated circuit verification method according to a sixth embodiment of the present invention. FIG. 16 is a timing chart indicating specific examples of an input clock, operation expected values of an output signal, and output signals obtained under MIN and MAX delay conditions, respectively.

As shown in the upper part of FIG. 14, a signal waveform used in typical logic verification changes digitally. However, the waveform of a test signal output from an actual test apparatus takes a period of time (a transition period) to change in logic level, as shown in the middle part of FIG. 14. In the transitional periods in which the signal level changes, the signal value is not clear. Thus, if expected value comparison times such as times (1) and (2) are set in these transition periods, a stable test may not be possible. The semiconductor integrated circuit verification method of this embodiment, which will be discussed below, is characterized in that signal transition periods are considered so that no expected value comparison is performed during the signal transition periods.

In the verification method shown specifically in FIG. 15, signal change periods 151 in test cycles are obtained by timing verification or the like in which a STA tool is used.

Then, addition 152 of a corresponding signal transition period is made to each of the signal change periods 151 in the test cycles. This step provides transition- period-including signal change periods 153 in the test cycles.

Next, the transition-period-including signal change periods 153 in the test cycles and (reference) operation expected values 154 are input into a computer or the like to extract expected value comparison times or perform expected value verification 155. In this step, if no expected value comparison times have been established, the expected value comparison times are set, and if the expected value comparison times have been established, expected value verification as to whether or not the values of an actual output signal match the expected values is performed.

Subsequently, the above-mentioned method will be discussed using the specific signal waveforms shown in FIG. 16. In the example shown in FIG. 16, the operation expected values of the output signal in the first through third cycles of the input clock are L, H, and L, respectively.

Also, under the MAX delay condition, delay may be increased depending on the circuit configuration to cause a signal change period to extend beyond the corresponding cycle (NCC). Nevertheless, FIG. 16 indicates a case in which no NCC occurs in the output signal produced under the MAX delay condition. Transition periods of the output from the test apparatus, shadowed with slanted lines in FIG. 16, are respectively added to the rise and fall times Umin and Dmin of the output signal produced under the MIN delay condition. Likewise, transition times shadowed with slanted lines are respectively added to the rise and fall times Umax and Dmax of the output signal produced under the MAX delay condition.

In this case, expected value comparison times are set within periods of time, in which the values of the respective output signals obtained under the MIN and MAX delay conditions are equal to the operation expected values. Then, the stable expected value comparison times, which withstand variation in the signal change periods, are obtained. In this step, the expected value comparison times are not set within the signal transition periods. More specifically, time ranges indicated by the double-headed arrows of "a pass range of L" and "a pass range of H" in FIG. 16 are the periods of time in which stable expected value comparison times can be set. By designating the expected value comparison times during the periods of time in which the values of the respective output signals obtained under the MAX and MIN delay conditions are equal to each other, it becomes possible to perform expected value comparison stably in each of the first through third cycles. In the example shown in FIG. 16, an expected value comparison time is set at the fall time Dmax of the signal, and from the time Dmax, other expected value comparison times are established for the respective cycles of the input clock, thereby enabling stable expected value comparison in each of the first through third cycles.

As described above, by considering the signal transition periods, more accurate verification based on the signal waveform output from the actual test apparatus is performed. As a result, it is possible to determine stable strobes and prepare a stable test pattern, which enables an increase in the accuracy of the test pattern and a decrease in the number of steps for preparing the test pattern.

It should be noted that as the load capacity within the test apparatus increases, the signal transition periods are increased. Other factors causing occurrence of the transition periods presumably include signal reflection.

In the foregoing description, the output signals produced respectively under the MAX delay condition and the MIN delay condition are used. Nevertheless, instead of the output signals obtained under these conditions, output signals generated under other multiple delay conditions which are different from each other may be used. The signal transition periods are not limited to the transition periods required for the rises and falls of the signals, but may include transition periods required for the signals to change to the Z level or unfixed values, as well as other periods of time required for the signals to change.

Seventh Embodiment

In a seventh embodiment, a semiconductor integrated circuit verification method, in which, of transition periods occurring in an output from a test apparatus, transition periods produced due to load capacity within the test apparatus are considered, will be discussed.

As discussed in the sixth embodiment, a waveform output from an actual test apparatus takes a certain amount of time (a transition period) to change in level. This transition period occurs due to rounding of the signal waveform and varies according to the state of the test apparatus including a test board and the state of the frequency of the signal, for example. Especially, load capacity within the test apparatus significantly affects the rounding of the signal waveform. More specifically, as the load capacity decreases, the rounding of the signal waveform decreases, while as the load capacity increases, the rounding of the signal waveform increases.

On the other hand, when a signal output from an LSI is at high impedance, a method is employed, in which the signal level is adjusted using a constant current source when a test is performed by a test apparatus. Also in this case, the test is performed after the transition period has elapsed, at which time the signal reaches the expected level.

Next, the procedure of the integrated circuit verification method of this embodiment will be discussed with reference to the associated drawings.

Figure 17:
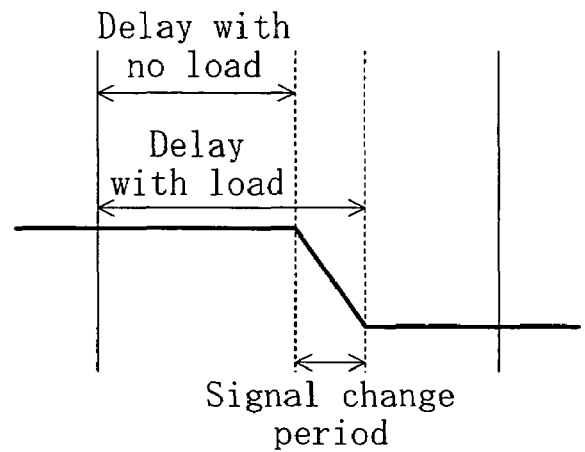
FIG. 17 is a timing chart indicating an exemplary waveform of a test signal output from a test apparatus.
Figure 18:
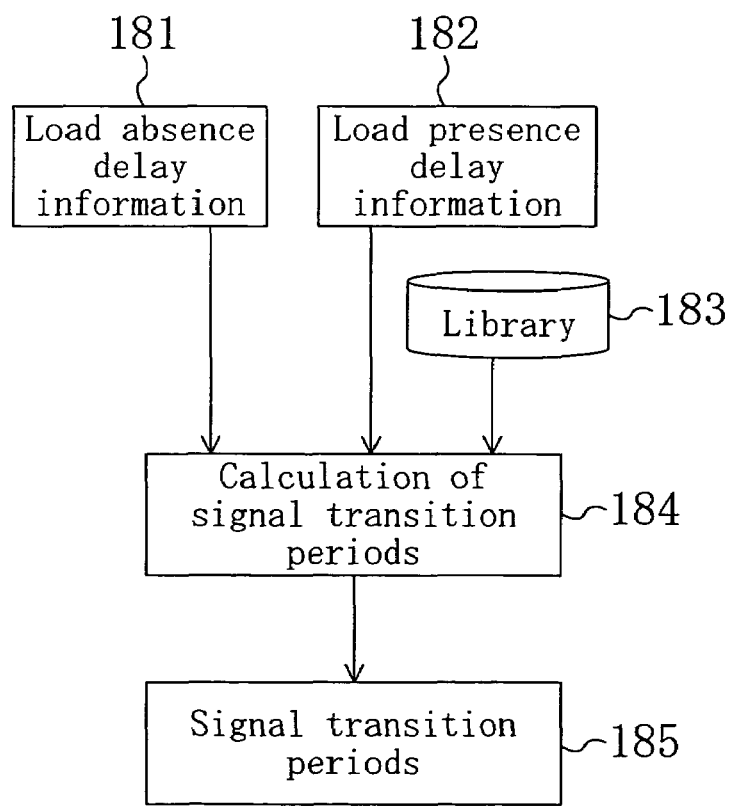
FIG. 18 is a flowchart indicating steps of a semiconductor integrated circuit verification method according to a seventh embodiment of the present invention, up to the step of calculating signal transition periods.
Figure 19:
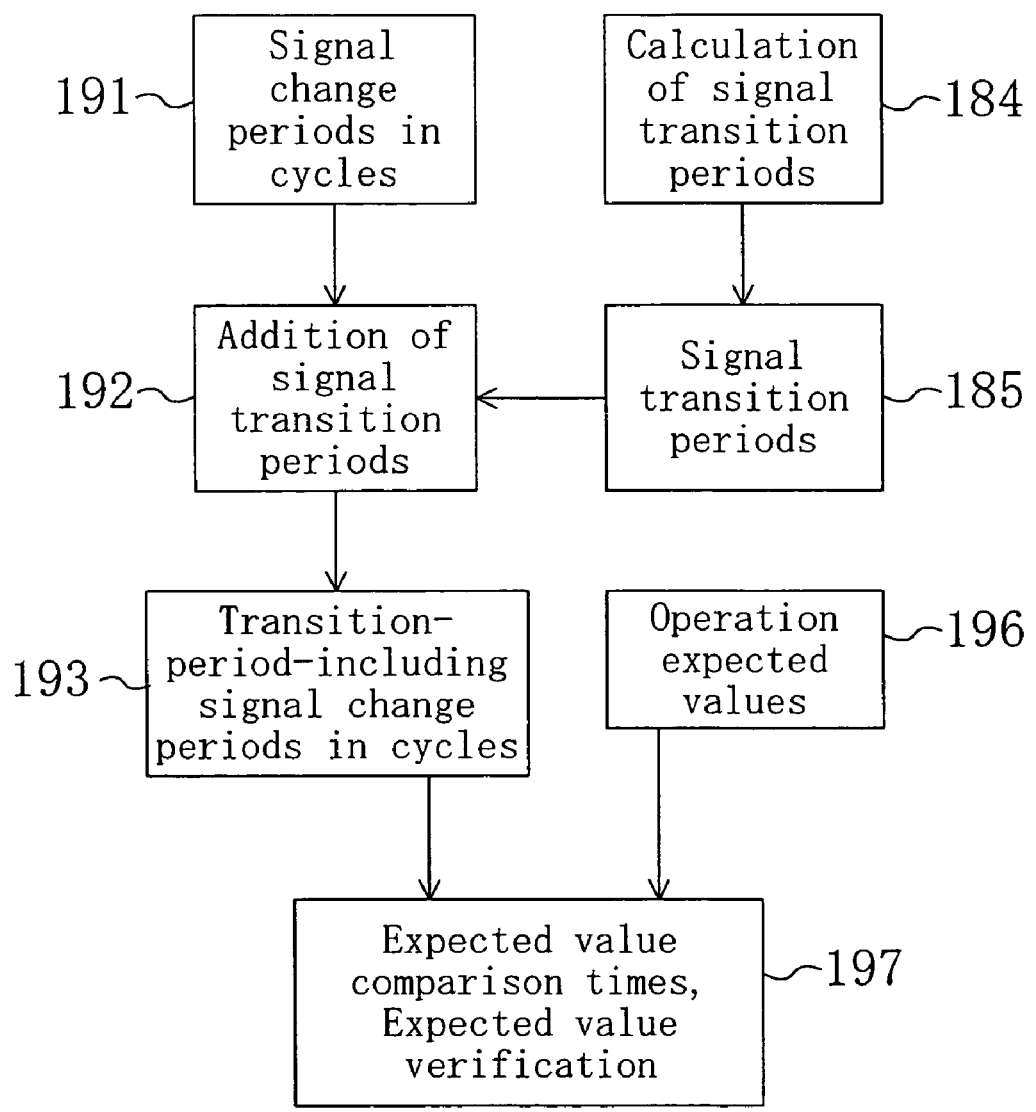
FIG. 19 is a flowchart indicating other steps of the semiconductor integrated circuit verification method of the seventh embodiment, up to the step of extracting expected value comparison times or performing expected value verification.

FIG. 17 is a timing chart indicating an exemplary waveform of a test signal output from a test apparatus. FIG. 18 is a flowchart indicating steps of the semiconductor integrated circuit verification method of this embodiment, up to the step of calculating signal transition periods. FIG. 19 is a flowchart indicating other steps of the semiconductor integrated circuit verification method of this embodiment, up to the step of extracting expected value comparison times or performing expected value verification.

As shown in FIG. 18, delay information for a case in which there is no load within a test apparatus (hereinafter referred to as "load absence delay information 181") and delay information for a case in which there is load within the test apparatus (hereinafter referred to as "load presence delay information 182") are input to a transition period calculation means (not shown) of the test apparatus, so that the transition period calculation section makes calculations 184 of signal transition periods. As shown in FIG. 17, in the output signal from the test apparatus, a delay time obtained based on the assumption that there is no load is subtracted from a delay time obtained when there is load in the test apparatus, thereby calculating the signal transition period. The transition period calculation means may be disposed within the test apparatus or a device external to the test apparatus. Also, in this step, when a high impedance measurement is performed, equations for calculating a signal transition period are used, because the measurement depends upon the capability of the cell(s) used. The equations are stored as a library 183. More specifically, power supply voltage, the current value of constant current source, load capacity and the like are given as parameters, whereby the calculation corresponding to the cell(s) used is performed. If the cell(s) includes a pull-up resistor, the value of the pull-up resistor is added as a parameter, so that the signal transition periods are calculated more accurately.

On the other hand, as shown in FIG. 19, signal change periods 191 in test cycles are obtained by timing verification or the like in accordance with the procedure explained in the first through fourth embodiments, for example.

Next, addition 192 of the signal transition periods is performed using the signal change periods 191 in the test cycles and the signal transition periods 185, thereby calculating signal change periods in the test cycles, in which the transition periods are considered (which will be hereinafter referred to as "transition-period-including signal change periods 193".)

Then, the transition-period-including signal change periods 193 and operation expected values 196 are used to extract expected value comparison times or perform expected value verification 197. In this step, if the expected value comparison times have not been established, the expected value comparison times are extracted, and if the expected value comparison times have already been established, expected value verification is performed.

As described above, in the verification method of this embodiment, the transition periods which vary in accordance with the load capacity of the test apparatus are calculated, and the extraction of the expected value comparison times or the expected value verification is performed in consideration of those transition periods. This enables more accurate verification based on the waveform of the test signal output from the actual test apparatus. Furthermore, this consequently allows the determination of stable strobes and the preparation of a stable test pattern, which permits an increase in the accuracy of the test pattern and a decrease in the number of steps for preparing the test pattern.

It should be noted that the above-described method of adding the signal transition periods is applicable not only to static verification but also to typical dynamic verification.

Figure 20:
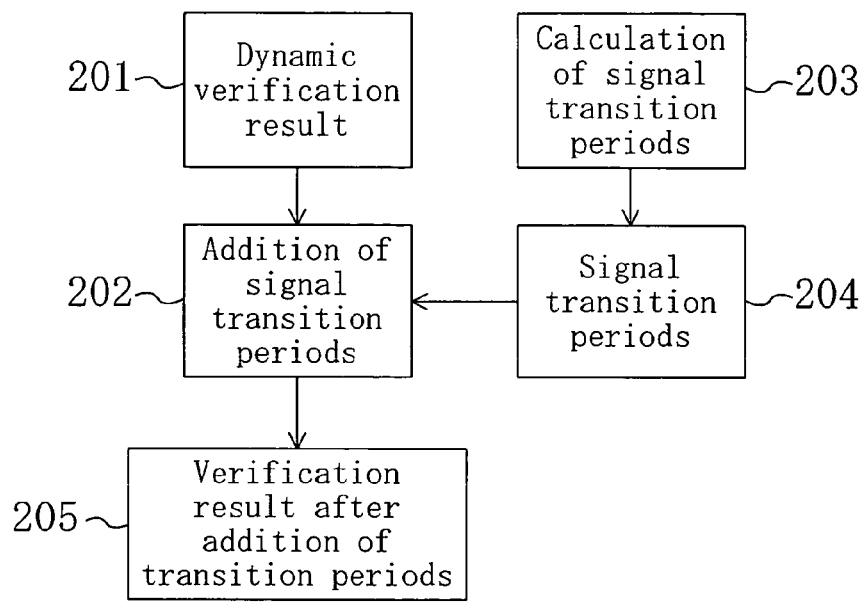
FIG. 20 is a flowchart indicating a modified example of the semiconductor integrated circuit verification-method of the seventh embodiment, in which dynamic verification is used.

FIG. 20 is a flowchart indicating a modified example of the semiconductor integrated circuit verification method of this embodiment, in which dynamic verification is used.

In this modified example, first, dynamic verification is performed for a semiconductor integrated circuit to be verified, and the result (i.e., the dynamic verification result 201) is obtained.

On the other hand, as described above, signal transition period calculation 203 is performed to obtain signal transition periods 204.

Next, the dynamic verification result 201 and the signal transition periods 204 are used to obtained verification result 205 after the addition of the signal transition periods 204. Based on the verification result after the addition of the transition periods, it is possible to determine times which are not suitable for expected value comparison.

Eighth Embodiment

Figure 21:
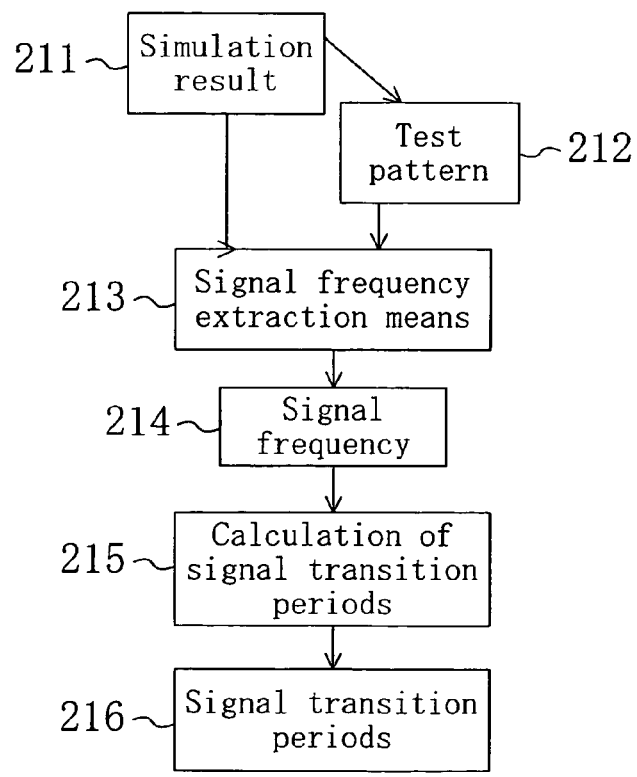
FIG. 21 is a flowchart indicating a semiconductor integrated circuit verification method according to an eighth embodiment of the present invention.

FIG. 21 is a flowchart indicating a semiconductor integrated circuit verification method according to an eighth embodiment of the present invention.

When an LSI which operates at high speed is tested, the load capacity of a test apparatus including a test board is treated not as a simple fixed value but as a distributed constant, which depends upon the frequency of a signal. Specifically, a signal transition period is expressed as a function of a signal frequency. The verification method of this embodiment uses a means for calculating signal transition periods from a signal frequency of an LSI.

More specifically, as shown in FIG. 21, a circuit simulation is performed for an LSI to be verified, thereby obtaining the simulation result 211. Then, from the simulation result 211, an appropriate test pattern 212 is derived.

Next, a signal frequency extraction means 213 extracts a signal frequency 214 from the simulation result 211 and the test pattern 212. The signal frequency extraction means 213 is a dedicated tool, for example, and may be incorporated in the test apparatus or in a computer or the like externally provided to the test apparatus.

Subsequently, a transition period calculation means (i.e., a verification tool or the like) performs signal transition period calculation 215 based upon the signal frequency 214, thereby calculating transition periods (i.e., signal transition periods 216) required for signal rises and falls.

In this step, a corresponding assumed load capacity may be calculated based on the signal frequency 214 to obtain load presence delay information, in which the frequency is considered, and load absence delay information. The load absence delay information and the load presence delay information are the same as those shown in FIG. 18 and described in the seventh embodiment.

As the information on the signal frequency 214, not only the information extracted by inputting the simulation result and the test pattern, but also frequency information stored in advance in a device external to the test apparatus may be used. The frequency information is supplied to the transition period calculation means, and the transition period calculation means calculates the signal transition periods 216.

After the signal transition periods 216 are determined, the subsequent process steps are performed in the same manner as in the seventh embodiment shown in FIG. 19. Specifically, expected value comparison times are extracted with consideration given to the signal transition periods 216, and if the expected value comparison times have been established in advance, expected value verification as to whether or not the values of an actually produced output signal match the expected values is performed.

In this manner, by calculating the signal transition periods in accordance with the signal frequency, highly accurate verification based on a waveform output from an actual test apparatus is performed, even if LSIs become capable of operating at higher speed in the future. More specifically, in the above-mentioned method, stable strobes can be determined and a stable test pattern can be prepared, permitting an increase in the accuracy of the test pattern and a decrease in the number of process steps for preparing the test pattern.

It should be noted that in the semiconductor integrated circuit verification method of this embodiment, it is possible to obtain the signal transition periods by directly inputting the simulation result into the signal frequency extraction means 213 instead of preparing the appropriate test pattern 212 using the simulation result 211.

Ninth Embodiment

Figure 23:
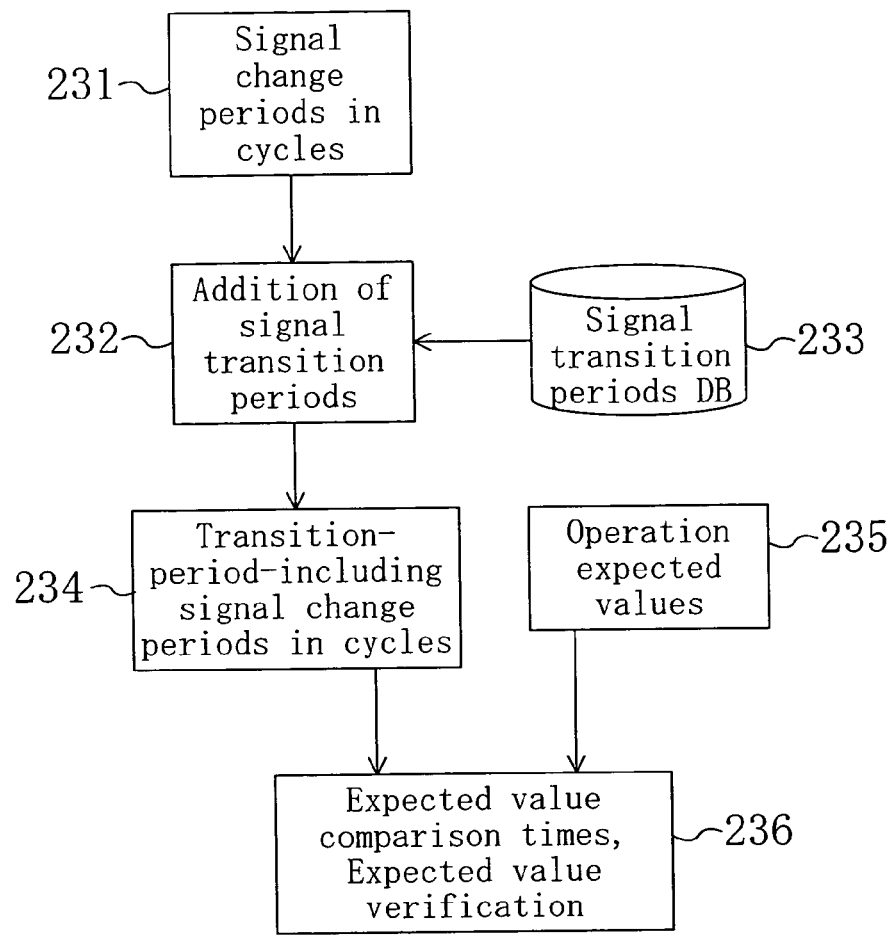
FIG. 23 is a flowchart indicating the semiconductor integrated circuit verification method of the ninth embodiment.

FIG. 22 indicates a database including various conditions and delay times used in a semiconductor integrated circuit verification method according to a ninth embodiment of the present invention. FIG. 23 is a flowchart indicating the semiconductor integrated circuit verification method of this embodiment.

Factors that make signals become unstable when they are changing in level include not only signal transition periods produced by the load capacity of a test apparatus, but also other causes, such as mismatches of the impedance of wires associated with the test apparatus during a test time, and reflection.

In actual LSI tests, signal unstable periods, in which signal levels become unstable due to various factors, vary. For example, the factors (which are conditions affecting signal transition periods) responsible for unstable signal levels include: the employed test jigs such as a test apparatus, board, socket and wiring; power supply voltage; the specs of the LSI such as the type of cell used; and operation conditions such as frequency.

The verification method of this embodiment includes a technique in which signal unstable periods corresponding to those various parameters are calculated or measured to be complied into a database, so that in performing verification of an integrated circuit, signal unstable periods (i.e., signal transition periods) are determined by searching the database based on specific values that the parameters will be likely to take when the integrated circuit is tested.

The database shown in FIG. 22 includes items such as test jig, LSI spec, operation condition, and transition period, for example. For instance, data in the first line indicates that a signal transition period required for a signal produced from the LSI to change from the H level to the L level is 0.5 ns. In this manner, the database used in this embodiment includes data on transition periods obtained in various cases, in which the parameters are combined with each other in various ways.

Hereinafter, the flow of verification in which this database is used will be discussed.

First, as shown in FIG. 23, signal change periods 231 in test cycles are prepared.

Next, addition 232 of signal transition periods extracted from a signal transition period database 233 is made to the signal change periods 231 in the test cycles. By this step, transition-period-including signal change periods 234 in the test cycles are generated.

Subsequently, by using operation expected values 235 and the transition-period-including signal change periods 234 in the test cycles, expected value comparison times are extracted or expected value verification 236 is performed.

In this manner, conditions which affect transition periods are stored in the database, and the transition periods extracted from the database are added to the signal change periods in the test cycles, whereby stable verification can be performed, even if the LSI operates at higher speed. More specifically, in accordance with the semiconductor integrated circuit verification method of this embodiment, highly accurate verification based on a waveform output from an actual test apparatus is also performed. As a result, stable strobes are determined and a stable test pattern is prepared, which enables an increase in the accuracy of the test pattern and a decrease in the number of steps for preparing the test pattern.

Tenth Embodiment

Figure 24:
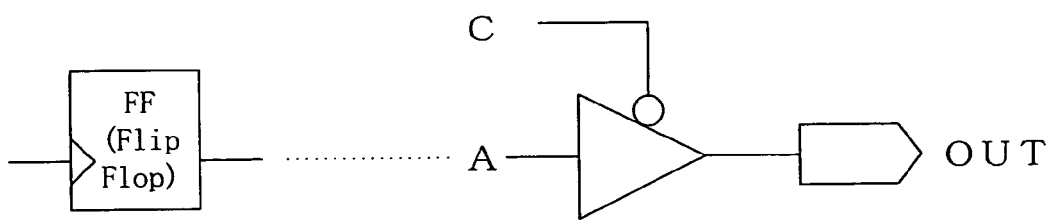
FIG. 24 is a view indicating an exemplary circuit in which a signal is output from a tri-state output buffer.
Figure 25:
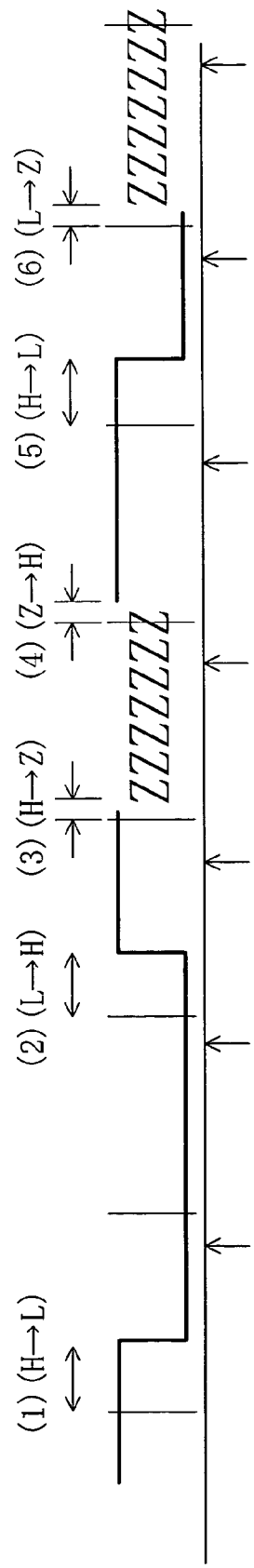
FIG. 25 is a timing chart indicating an output signal from the circuit shown in FIG. 24.
Figure 26:
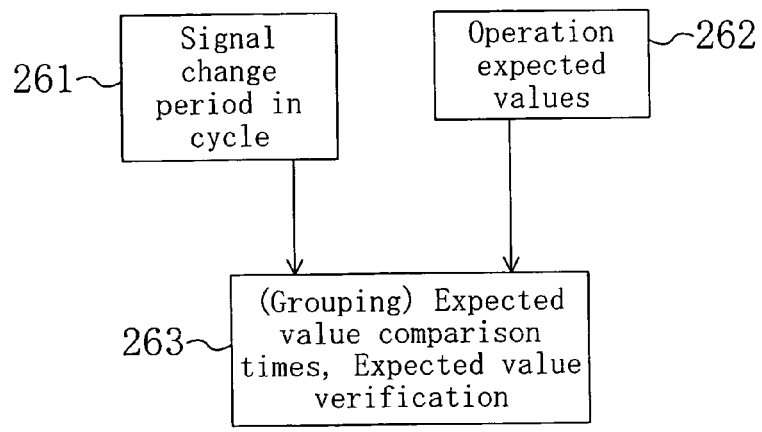
FIG. 26 is a flowchart indicating a semiconductor integrated circuit verification method according to a tenth embodiment of the present invention.

FIG. 24 is a view indicating an exemplary circuit in which a signal is output from a tri-state output buffer. FIG. 25 is a timing chart indicating an output signal from the circuit shown in FIG. 24. FIG. 26 is a flowchart indicating a semiconductor integrated circuit verification method according to a tenth embodiment of the present invention.

A signal output from the tri-state output buffer shown in FIG. 24 passes through one of two paths (signal transmission paths): C→OUT and A→OUT.

Referring to the specific example, in FIG. 25, of an output waveform produced from the circuit, changes involving Z, such as an H to Z change (3), are made when the signal passes through the path C→OUT. The other changes, such as an H to L change (1), are made when the signal passes through the path A→OUT. In this way, when the signal passes through the different paths in its different cycles, delay time of the signal varies depending on which path the signal goes through. Therefore, to perform expected value comparison reliably, expected value comparison times specifically corresponding to the respective paths may be set.

However, in some test apparatuses, the number of timings that can be set therein is limited. It is thus preferable that the number of timing based on which the expected value comparison times are set be as small as possible. Even though the number of timings established is within the test apparatus constraints, setting many timings in the test apparatus takes a long time, in which case a speedy test may not be possible. Therefore, it is most desirable to set expected value comparison times that allow the respective expected value comparison to be performed with respect to a common timing, irrespective of which path the signal passes through. As described above, it is basically desirable that the expected value comparison times be set with respect to a single timing, regardless of which path the signal goes through. Nevertheless, it is difficult to do so, because LSIs have been increasingly miniaturized recently. Setting the expected value comparison times with respect to a single timing may lead to cases in which expected value comparison is not performed (that is, expected value masking occurs.) in a cycle(s) of the signal.

However, if expected values are masked in cycles which are critical to verification of the circuit operation, problems such as occurrence of failures are caused. In this case, times at which expected value comparison is performed need to be divided into groups according to the test apparatus constraints. Particularly, in the case of the output buffer shown in FIG. 24, the delay tendency exhibited when the signal passes through the path C→OUT may significantly differ from that exhibited when the signal passes through the path A→OUT. Thus, if expected value comparison times are grouped according to the respective conditions, the number of masked potions is reduced finally, which makes it easier to extract expected value comparison times at which expected value comparison can be performed stably.

The semiconductor integrated circuit verification method of this embodiment is a method in which expected value comparison times are grouped according to the signal expected values (i.e., the signal paths). This method will be discussed below.

In the example of FIG. 24, the sections (1) through (6) shown in FIG. 25 are divided into the sections (3), (4) and (6), in which Z-related changes are made, and the other sections (1), (2) and (5). The grouping may be performed based not only on the signal values but also on the amount of delay. More specifically, those sections which are found, after timing verification results are obtained, to have a similar length of delay may be grouped together.

Next, as shown in FIG. 26, expected value comparison times are extracted, or in a case where the expected value comparison time have been established beforehand, expected value verification as to whether or not the values of an actual output signal match the expected values is performed (the extraction of the expected value comparison times or the expected value verification 263.) Prior to this step, signal change periods 261 in the test cycles and operation expected values 262 are input to a verification tool.

As described above, the use of this method allows efficient usage of the functions of the test apparatus, thereby shortening the test time. Furthermore, this method enables test pattern verification and test pattern preparation for performing a highly accurate test in which fault coverage is not reduced, while allowing a decrease in the number of steps required for preparing the test pattern.

FIG. 24 indicates the case in which there are two signal paths. Nevertheless, even if there are three or more paths, grouping can be performed in the same manner to extract expected value comparison times, or expected value verification can be performed.

Eleventh Embodiment

Figure 27:
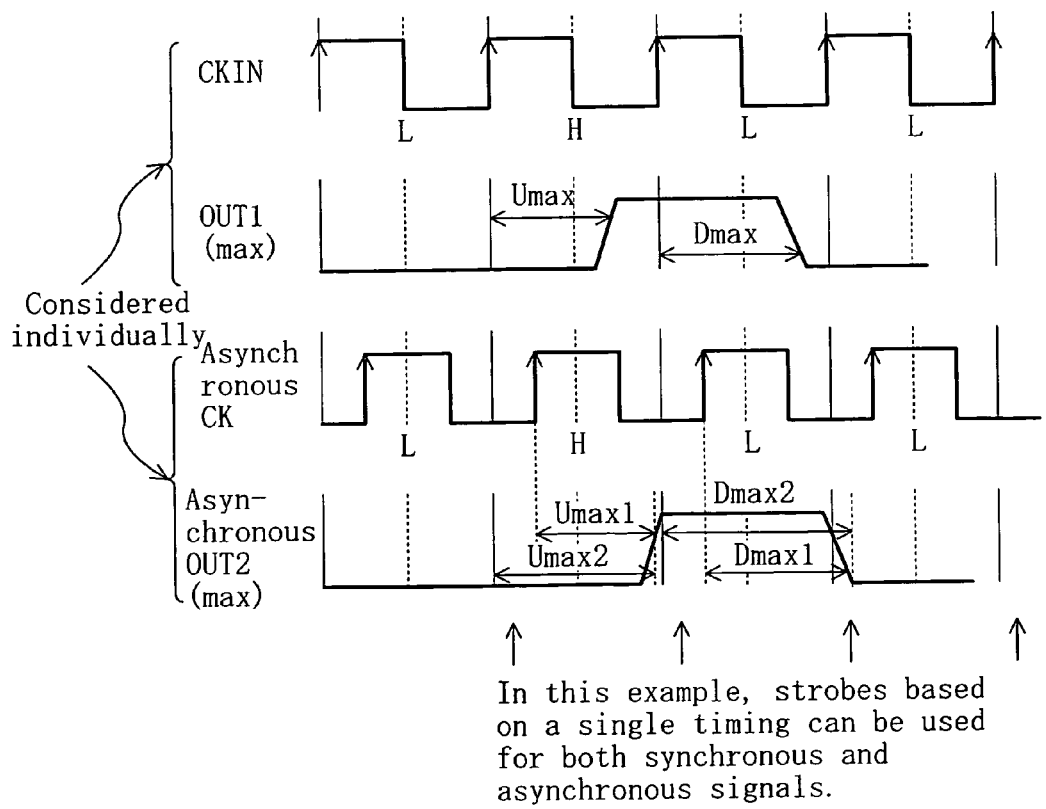
FIG. 27 is a timing chart for explaining a semiconductor integrated circuit verification method according to an eleventh embodiment of the present invention.
Figure 28:
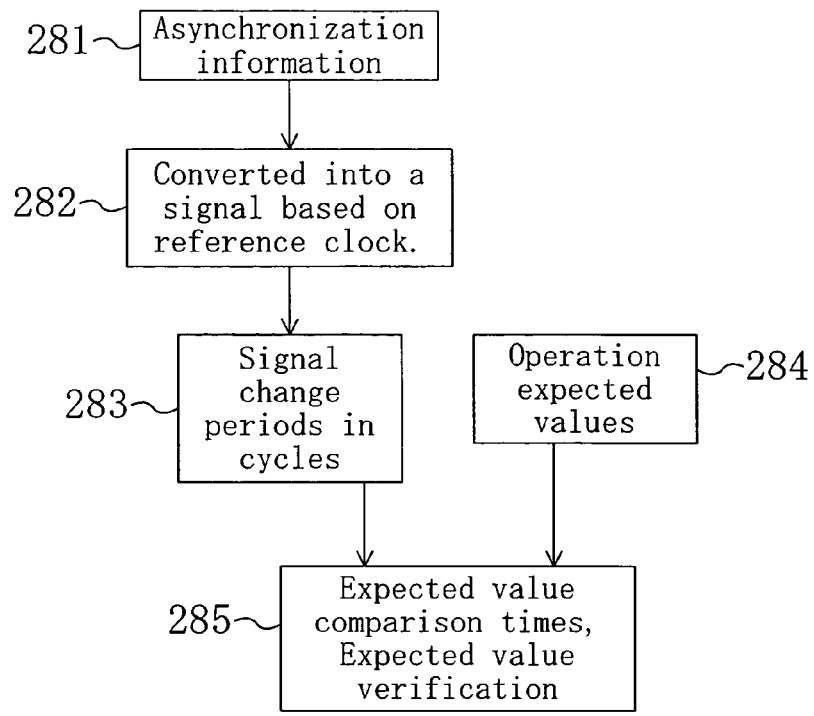
FIG. 28 is a flowchart indicating the semiconductor integrated circuit verification method of the eleventh embodiment.

FIG. 27 is a timing chart for explaining a semiconductor integrated circuit verification method according to an eleventh embodiment of the present invention. FIG. 28 is a flowchart indicating the semiconductor integrated circuit verification method of this embodiment.

In some cases, LSIs operate based not only on a system clock (i.e., a reference clock) but also on a plurality of clock signals including asynchronous clock signals. In this case, operation verification of the circuit is performed on a cycle-by-cycle basis, and this process is performed after a signal output in synchronization with an asynchronous clock signal is converted into a signal which is based on the system clock. The verification method of this embodiment includes a technique in which verification is performed by converting an output signal from an asynchronous terminal into a signal which is based on a reference clock. This verification method will be discussed below.

A signal from a terminal OUT1 shown in FIG. 27 is output in synchronization with a system clock signal CKIN. On the other hand, a signal from a terminal OUT2 is output in synchronization with a clock signal CK which is asynchronous to the system clock signal CKIN.

In this case, a signal converted to be based on the cycle of the system clock signal CKIN is used to perform a test. For example, the time, at which the output from the terminal OUT2 reaches the maximum voltage value when it rises from the L level to the H level, is originally Umax1, which is synchronous with the asynchronous clock signal CK. In the verification method of this embodiment, Umax1 is converted so as to be based on the system clock signal CKIN and become Umax2. Exemplary ways to perform this conversion is as follows. In cases where the system clock signal CKIN and the clock signal CK have the same period but their timings are different from each other, Umax1 is converted into Umax2 by shifting Umax1 by the time difference between the rise times or fall times of the respective signals. In cases where the clock signals have different periods, the period of the clock signal CK is corrected in accordance with the system clock signal, for example, thereby obtaining Umax2.

When the output from the terminal OUT2 falls from the H level to the L level, Dmax1 is converted to Dmax2 in the same manner as in the case of Umax1. In this manner, extraction of expected value comparison times and expected value verification are performed based not on the asynchronous clock signal CK but on the signal converted to be based on the system clock signal. In this embodiment, only the output signals from the respective terminals OUT1 and OUT2, whose respective delay is maximum, are described, but, as described in the second embodiment, the expected value comparison times may be set with consideration also given to the case of minimum delay.

Next, the specific flow of the verification method of this embodiment will be described.

First, as shown in FIG. 28, by using information, that is, asynchronization information 281, on delay of an output from a terminal which is not synchronous with the system clock, the output from the terminal which is synchronous with an asynchronous clock signal is converted so as to be based on the system clock (step 282). In this step, the conversion is performed by the above-described method. This process is conducted by a conversion means such as a dedicated verification tool.

Next, signal change periods 283 in test cycles are extracted using the converted signal.

Subsequently, the signal change periods 283 in the test cycles and operation expected values 284 are input into a verification tool or the like to extract expected value comparison times or perform expected value verification 285. In this step, the expected value comparison times are established, or in a case in which the expected value comparison times have been established in advance, the expected value verification as to whether or not the values of an actual output signal match the expected values is performed.

In this step, the output from the terminal OUT1 and the output from the terminal OUT2 may be considered individually, and the expected value comparison times may be set for each of the outputs. Alternatively, as shown in FIG. 27, in a case where the expected value comparison times for the outputs from the terminals OUT1 and OUT2 can be set with respect to a single timing, the expected value comparison times may be established in that manner. It is desirable that the expected value comparison times be set with respect to a single timing, because the verification time can be shortened.

As described above, according to the verification method of this embodiment, not only a signal from a terminal which depends upon a system clock signal (i.e., a reference clock signal) but also a signal from a terminal which depends upon an asynchronous clock signal can be verified at the same time, which extends the range of application of this method.

Twelfth Embodiment

Figure 29:
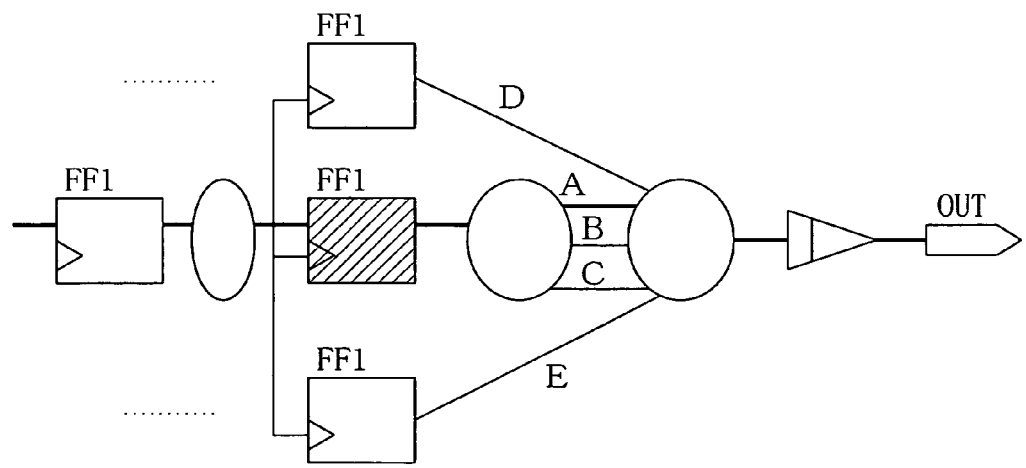
FIG. 29 is a view schematically illustrating an exemplary integrated circuit to be verified.
Figure 30:
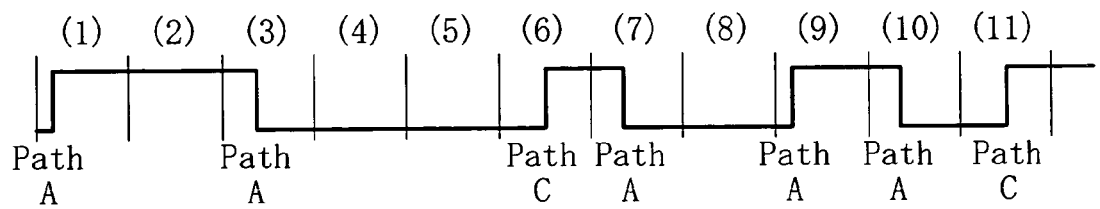
FIG. 30 is a timing chart illustrating the waveform of an output signal from the circuit shown in FIG. 29.
Figure 31:
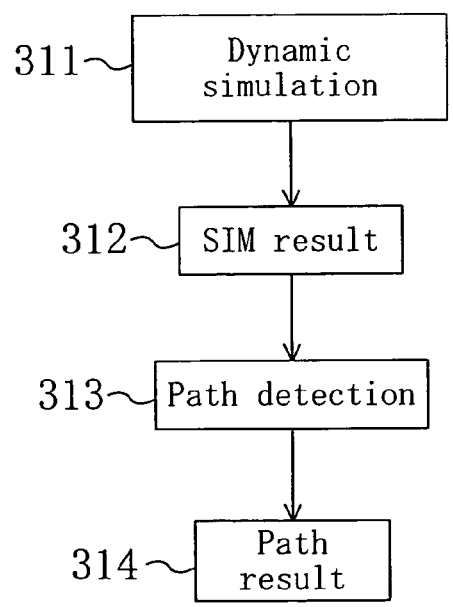
FIG. 31 is a flowchart indicating a semiconductor integrated circuit verification method according to a twelfth embodiment of the present invention.

FIG. 29 is a view schematically illustrating an exemplary integrated circuit to be verified. FIG. 30 is a timing chart indicating the waveform of an output signal from the circuit shown in FIG. 29. FIG. 31 is a flowchart indicating a semiconductor integrated circuit verification method according to a twelfth embodiment of the present invention.

As shown in FIG. 29, the circuit that operates in accordance with a system clock signal outputs a signal to an external terminal through several last-stage flip flops and logic gates. Thus, appropriate expected value comparison times may vary depending on through which flip flop or path the signal passes.

In the circuit shown in FIG. 29, delay in each cycle which occurs when the signal is output to the terminal OUT changes depending upon through which one of the paths A through E the signal passes in that cycle. Although the paths that the signal passes through in its respective cycles may differ from each other, a delay produced in each cycle reflects the corresponding one of the paths. The paths through which the signal passes in its respective cycles can be confirmed by performing dynamic simulation (dynamic verification) to obtain the signal change periods.

In the example shown in FIG. 30, it is confirmed, from the dynamic verification results, that when the signal rises from the L level to the H level, the signal is output through one of two paths (i.e., the paths A and C), and when the signal falls from the H level to the L level, the signal is output through one path (i.e., the path A). Since delay time for each path is known, the path through which the signal passes in each cycle can be determined from the delay time of the signal change in that cycle.

Next, the specific flow of the path extraction method of this embodiment will be described with reference to FIG. 31.

First, dynamic verification 311 is performed to obtain simulation result 312. In this step, the simulation may be performed under one of possible conditions, such as a MAX delay condition, a MIN delay condition, or a condition in which delay due to capacity within a test apparatus is considered.

Then, path detection 313 is performed using the simulation result 312. In this step, a verification tool detects delay times in signal changes from the simulation result 312, thereby extracting a signal path for each signal change point, for example. In this step, path result 314 may be output as the result of the detection.

FIG. 32 indicates the result of the path detection obtained in the verification method of this embodiment. FIG. 32 includes items such as output terminal, cycle number, signal change, and delay time, and shows in which cycle, with how much delay, and how, the signal changes. The delay times shown in FIG. 32 may also be obtained from dynamic verification, if the start times of the respective desired cycles are known.

In this embodiment, the path result shown is used to establish expected value comparison times or perform expected value verification.

The path result may be output as a file. If an undesirable signal change occurs in a cycle(s), process for masking that cycle(s) may be performed using this file so that no expected value comparison is performed in that cycle(s).

As described above, in the verification method of this embodiment, even if a plurality of paths are present in a circuit to be verified, path detection is carried out just by performing dynamic verification at least one time, which shortens the amount of time required to perform verification of the circuit as compared with a case in which dynamic verification has to be performed many times. Also, as a result of the path detection, output from unnecessary paths, through which the signal is not expected to pass, can be identified so that such output will not be compared with the expected value. This consequently allows the preparation of a test pattern which enables a stable test, thereby increasing the accuracy of the test.

Thirteenth Embodiment

Figure 34:
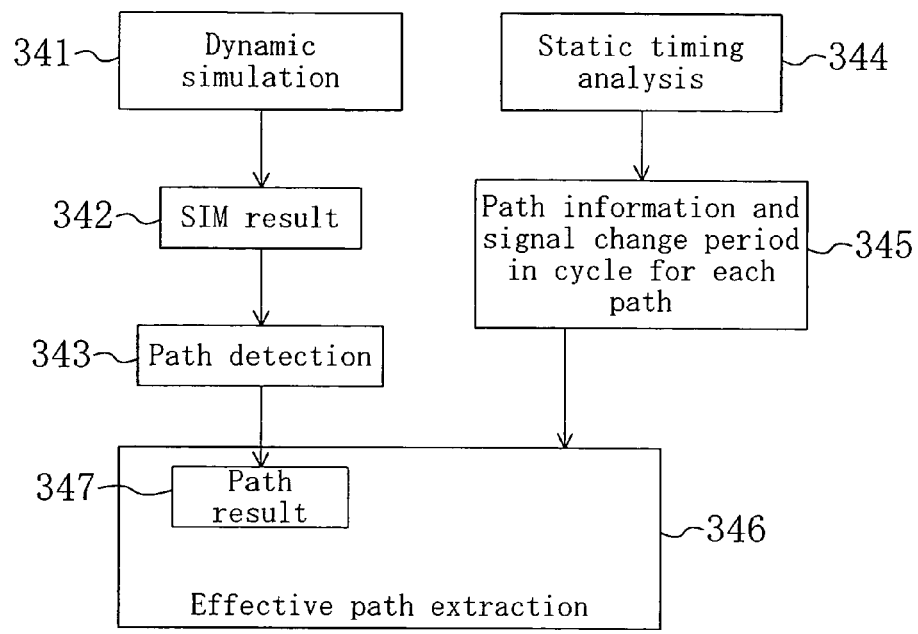
FIG. 34 is a flowchart indicating the semiconductor integrated circuit verification method of the thirteenth embodiment of the present invention.

FIG. 33 indicates results of path detection obtained in a semiconductor integrated circuit verification method according to a thirteenth embodiment of the present invention. FIG. 34 is a flowchart indicating the semiconductor integrated circuit verification method of this embodiment.

Signal delay in target circuit paths can be calculated using static timing analysis. For instance, results such as shown in FIG. 33 can be calculated by carrying out static timing analysis with respect to the output signal shown in FIG. 30. In this example, in the case of the signal rise from the L level to the H level, the signal passes through one of five paths, and there is a delay time in each rise phase. If the results shown in FIG. 33 and the path results shown in FIG. 32 obtained by the dynamic verification are examined together, it is found that the signal is output through the path A in the first cycle in the simulation, through the path A in the third cycle, the path C in the sixth cycle, and the path A in the seventh cycle. As described above, the verification method of this embodiment includes a technique for specifying paths, which are effective during simulation, by using the static timing analysis and the dynamic verification result.

Next, the specific flow of the effective path extraction method of this embodiment will be described with reference to FIG. 34.

First, dynamic verification 341 is performed to obtain simulation result 342.

Then, path detection 343 is performed using the simulation result 342. Considering that dynamic verification is process which requires a very long time, it is sufficient that the simulation result be obtained in at least one mode in this method, because the simulation result is used as information for performing the path extraction in this method.

On the other hand, static timing analysis 344 is carried out in the same mode as the dynamic verification, so that path information such as shown in FIG. 33 and signal change periods 345 in test cycles for the respective paths are output.

Subsequently, effective path extraction 346 is performed using the path information, the test-cycle signal change periods 345 for the respective paths, and the results of the path detection 343 (i.e., the path results 347). In this step, the effective path extraction means used is a dedicated tool or the like, and the path results 347 may be, and does not have to be, included in the effective path extraction means.

In this manner, the effective paths are specified for the respective paths, and based on this, the expected value comparison times are established or the expected value comparison is performed. This finally allows stable strobes which withstand variation to be determined, thereby enabling the preparation of a stable test pattern. Moreover, according to the verification method described above, the time-consuming dynamic verification does not have to be conducted in multiple modes. Consequently, the operation verification of the circuit having the multiple paths is performed more speedily as compared with conventional verification methods using dynamic verification.

In cases, as in the case of a scan test, where target output terminals are limited, if the other non-target terminals are not used in verification, the process time is shortened in the above-mentioned method. In such a case, the process is performed without considering those other non-target terminals in the dynamic simulation and the static timing analysis, to finally extract effective paths.

Figure 35:
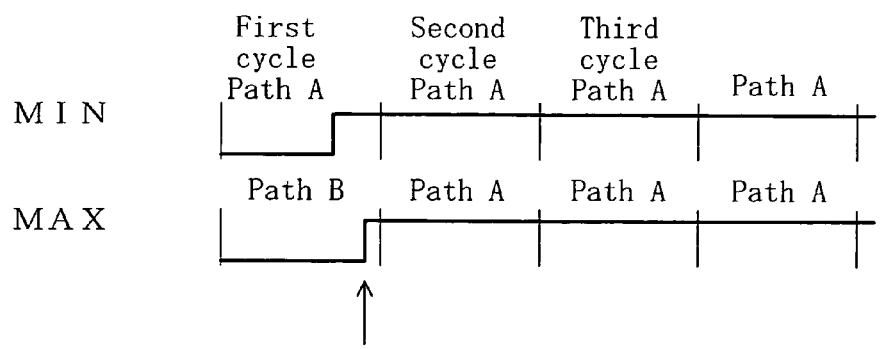
FIG. 35 is a timing chart indicating output signals from an integrated circuit to be verified obtained under a MIN delay condition and a MAX delay condition.
Figure 36:
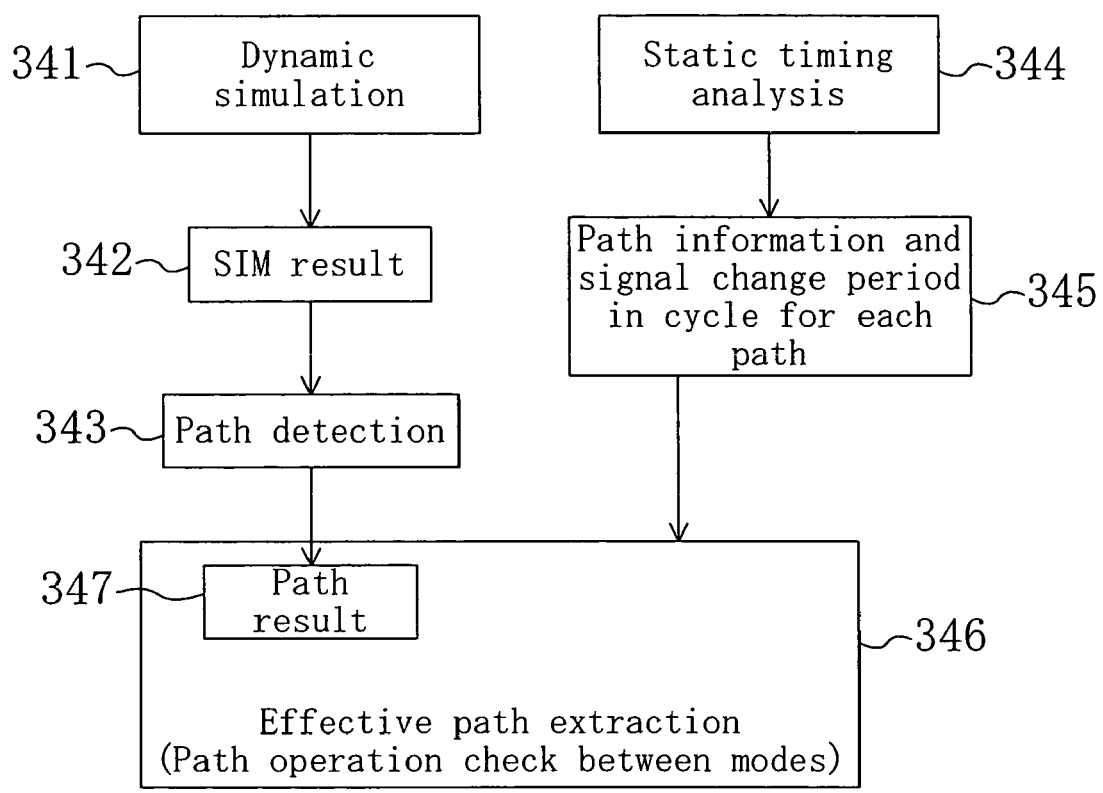
FIG. 36 is a flowchart indicating a modified example of the verification method of the thirteenth embodiment.

Modified Example of the Semiconductor Integrated Circuit Verification Method of the Thirteenth Embodiment FIG. 35 is a timing chart indicating output signals from an integrated circuit to be verified obtained under a MIN delay condition and a MAX delay condition. FIG. 36 is a flowchart indicating a modified example of the verification method of the thirteenth embodiment.

As shown in FIG. 36, in the semiconductor integrated circuit verification method of this modified example, dynamic verification 341 and static timing analysis 344 are each carried out in multiple modes and effective path extraction 346 is performed in the respective modes. And the effective paths in the cycles extracted in the respective modes are compared with each other on a cycle-by-cycle basis.

In the example shown in FIG. 35, in which the effective paths are extracted under the MIN and MAX delay conditions, the path used in the first cycle under the MIN delay condition differs from that under the MAX delay condition.

As in this case, if different paths are extracted for the same cycle, it is assumed the circuit operation is out of the ordinary.

In the verification method of this embodiment, an effective path extraction means has the function of making comparison between effective paths obtained in two or more modes so as to check the circuit operation. A verification tool that includes the effective path extraction means may function to automatically mask any detected cycles in which different effective paths are extracted, so that no expected value comparison is performed in those cycles.

This increases the accuracy of fault detection to a higher degree as compared with the method of the thirteenth embodiment in which simulation result and timing analysis result obtained in a single mode are used. However, in the verification method of this modified example, dynamic verification is performed two or more times, causing the verification time to be increased. Therefore, the verification method of the thirteenth embodiment and the verification method of this modified example may be chosen appropriately according to need.

Fourteenth Embodiment

FIG. 37 indicates data such as delay times occurring when output signals from the circuit shown in FIG. 29 change in level in cases where there is no load and there is load. FIGS. 38A through 38C indicate a semiconductor integrated circuit verification method and a test pattern preparation method according to a fourteenth embodiment of the present invention.

LSIs need to operate in accordance with various load capacities. For instance, in the upstream stage of design, LSIs need to perform logic operation without load and operation with the load capacity of the set, in which the LSI is used, being present. And when a test is carried out using a test apparatus, the LSI needs to operate with the load capacity within the test apparatus being present. The load capacity within the test apparatus varies depending upon the type of test apparatus. Therefore, when the test apparatus is replaced with a different one, operation corresponding to the load capacity of that different device has to be considered. In addition, assuming that operation of the LSI varies, the LSI has to be reliably operated in a plurality of modes (MIN and MAX, for example.)

Conventionally, in order to ensure such operation, it has been necessary to carry out dynamic verification in multiple modes in accordance with the respective load capacities.

In contrast, in the semiconductor integrated circuit verification method of this embodiment, pseudo results of dynamic verification are output without actually performing the time-consuming dynamic verification.

Assume that in the circuit shown in FIG. 29, dynamic signal changes such as shown in FIG. 30 are made in a given mode. More specifically, assume the case in which the circuit to be analyzed is the same as that of the thirteenth embodiment and the effective path specification result shows that the signal passes through the path A and changes from the L level to the H level in the first cycle, passes through the path A and changes from the H level to the L level in the third cycle, and passes through the path C and changes from the H level to the L level in the sixth cycle.

First, as shown in FIG. 38A, static timing analysis 361 is carried out, so that signal change periods in the respective paths which correspond to assumed load capacities are generated in multiple modes. By doing this, a list of the signal change periods 362 is obtained. The specific example of the signal change period list in FIG. 37 shows how signals, when passing through the paths A and C, change, e.g., from the L level to the H level and from the H level to the L level, in the cases of the MIN delay and the MAX delay under various load conditions: under no load; with the load capacity of the set into which the LSI is incorporated; with the load capacity of a test apparatus (tester) A; and with the load capacity of a test apparatus B. Each delay value may be expressed as a difference obtained with a given reference load capacity being considered as 0.

Next, as shown in FIG. 38B, an pseudo-simulation-result calculation means 366 outputs pseudo simulation results 367 based on the signal change periods 362 and effective path specification results 364 generated by the method of the thirteenth embodiment. The pseudo simulation results 367 can be dealt with as dynamic verification results obtained with the respective load capacities being present in the respective modes. In this step, if dynamic verification result at least in one mode has been obtained, it is possible to output the pseudo simulation results in the multiple modes. The pseudo simulation result calculation means 366 is software such as a verification tool, for example, and may be incorporated in the test apparatus or an external device.

Next, as shown in FIG. 38C, it is possible for a test pattern verification means 370 to carry out test pattern verification using the multiple pseudo simulation results 367 and thereby extract a test pattern 371 which operates stably with the respective load capacities being present in the multiple modes. It should be noted that in a case where expected value comparison times are desired to be extracted, no input signal is necessary, and if the expected value comparison times are generated based on the pseudo simulation results 367 without using any input signal, data size can be reduced significantly.

As described above, in this method, just by performing dynamic verification at least in one mode, dynamic verification results in the other modes or under the other load capacity conditions can be calculated in a pseudo manner. Particularly in this method, the dynamic verification does not have to be carried out many times, it becomes possible to output results equivalent to dynamic verification results in a shorter time as compared with conventional methods. Furthermore, extraction of expected value comparison times corresponding to various load capacities, and expected value verification can be performed in a shorter time.

Fifteenth Embodiment

Figure 39:
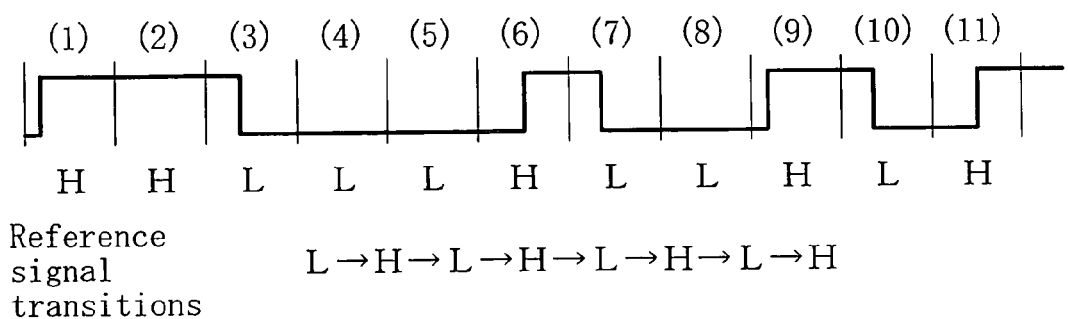
FIG. 39 is a timing chart indicating an exemplary output signal from a circuit to be verified.
Figure 40:
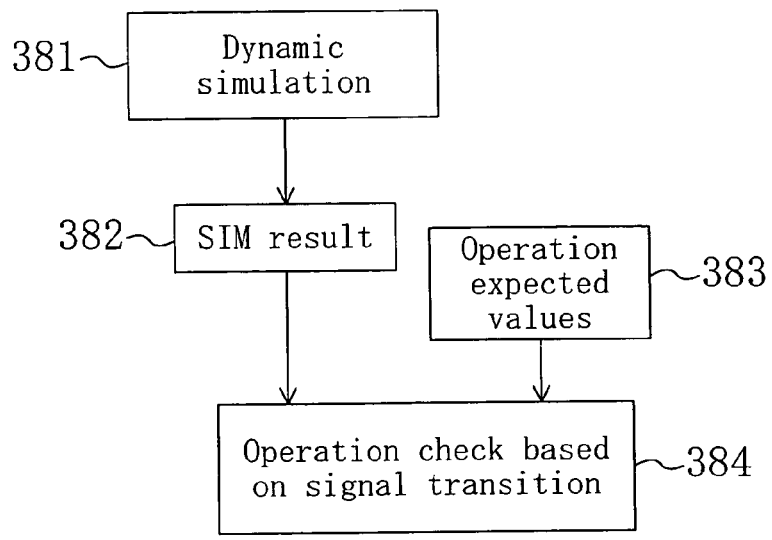
FIG. 40 is a flowchart indicating a method for checking operation of a semiconductor integrated circuit in accordance with a fifteenth embodiment of the present invention.
Figure 41:
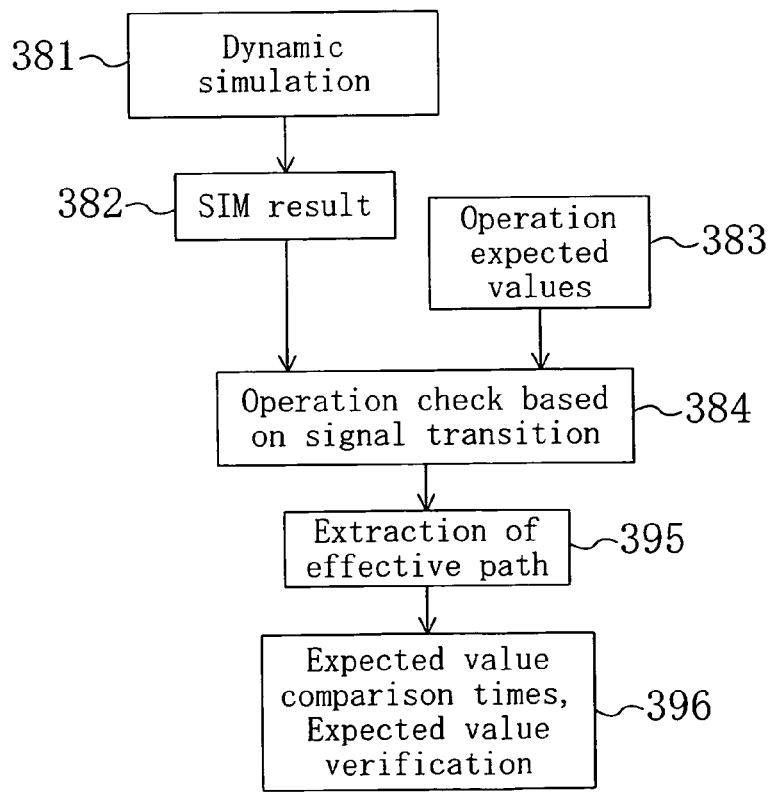
FIG. 41 is a flowchart indicating a semiconductor integrated circuit verification method according to the fifteenth embodiment of the present invention.

FIG. 39 is a timing chart, indicating an exemplary output signal from a circuit to be verified. FIG. 40 is a flowchart indicating a method for checking operation of a semiconductor integrated circuit in accordance with a fifteenth embodiment of the present invention. FIG. 41 is a flowchart indicating a semiconductor integrated circuit verification method of this embodiment.

Typically, expected values to be referenced when a circuit is operated have been determined and transitions to be made by a signal have also been determined.

Hereinafter, an exemplary circuit whose output signal is expected to make transitions such as shown in FIG. 39 will be described. In this example, the output signal makes L→H→L→H→L→H→L→H transitions as a whole. If a signal compared makes L→H→L→Z transitions, for example, it is determined that the circuit does not operate properly. On the other hand, when each cycle is seen, the signal makes an H to L transition in the third cycle. Unless the signal levels H and L are both present in the third cycle, an H to L transition is impossible. Therefore, in that case, it is also determined that the circuit does not operate correctly. Also, if the expected H to L transition is not present throughout the cycles, the cycle does not operate properly. On the other hand, if an L to H transition is present in a cycle in which no L to H transition should occur, it is found that the circuit does not operate properly. As described above, the fifteenth embodiment relates to a method for determining whether or not a circuit operates correctly based on signal transitions.

With reference to FIGS. 40 and 41, the specific procedure of the semiconductor integrated circuit verification method of this embodiment will be described.

First, dynamic verification 381 is performed for an integrated circuit to be verified and simulation result 382 is obtained.

Then, the simulation result 382 and operation expected values 383, which have been prepared separately, are used to perform an operation check based on signal transitions. This step is performed by a verification tool used in the first and second embodiments, for example, or by a dedicated tool. In a case where only the signal level transitions are desired to be checked, the procedure may be ended with this step. In a case where operation of the integrated circuit is to be verified, the procedure goes to the next step.

Next, as shown in FIG. 41, effective path extraction 395 is performed by an effective path extraction means. In this step, an effective path is specified in each cycle by the method explained in the thirteenth embodiment, for example.

Subsequently, extraction of expected value comparison times or expected value verification 396 is carried out using the result of the operation check performed based on the signal transitions and the result of the effective path extraction. By performing the effective path extraction 395 prior to this step, it becomes possible to check beforehand whether the data, such as the simulation result 382 and the operation expected values 383, used in the expected value comparison time extraction or the expected value verification, is the data that is obtained when the circuit operates properly.

In the verification method of this embodiment, if operation of the circuit is to be simply checked only in terms of signal transitions, a cycle-independent operation check can be performed using a test pattern prepared based on the verification result. In this case, it is possible to identify a case in which an LSI is actually defective even if the LSI seems to operate correctly in a test performed by a conventional method, because such a conventional test is conducted on a cycle-by-cycle basis.

In the above described exemplary case, the operation expected values to be referenced and the simulation result obtained in a target mode are used. However, the verification method of this embodiment is applicable to cases where simulation results obtained in multiple modes such as a MIN condition and a MAX condition are input. This provides more accurate circuit verification.

Sixteenth Embodiment

Figure 42:
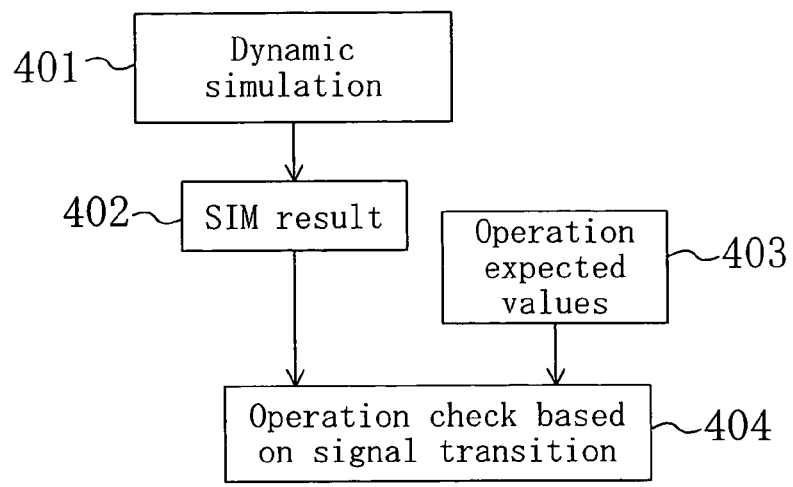
FIG. 42 is a flowchart indicating a method for checking operation of a semiconductor integrated circuit in accordance with a sixteenth embodiment of the present invention.
Figure 43:
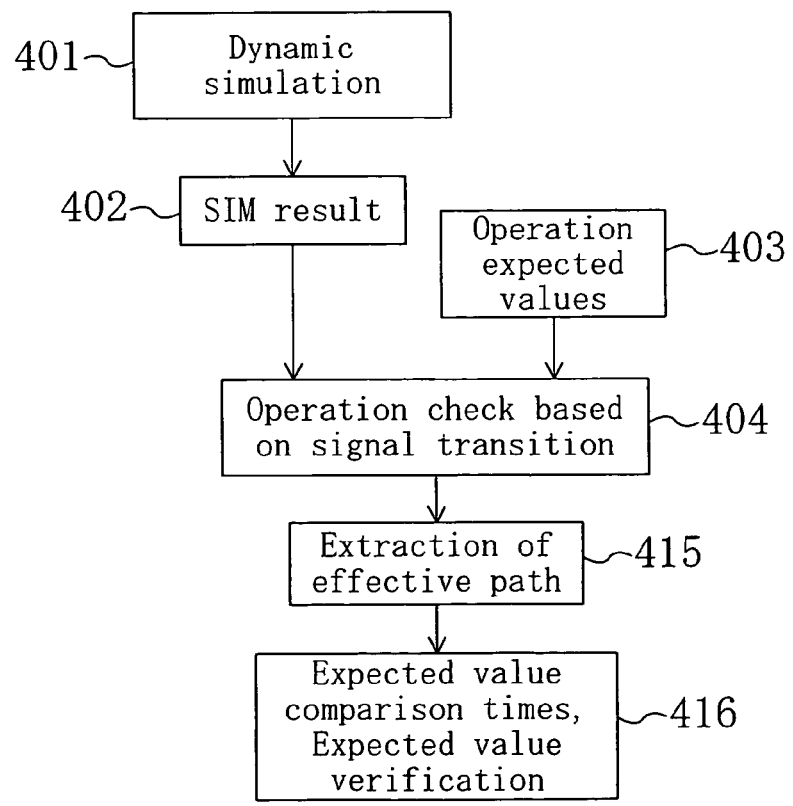
FIG. 43 is a flowchart indicating a semiconductor integrated circuit verification method according to the sixteenth embodiment of the present invention.

FIG. 42 is a flowchart indicating a method for checking operation of an semiconductor integrated circuit in accordance with a sixteenth embodiment of the present invention. FIG. 43 is a flowchart indicating a semiconductor integrated circuit verification method of this embodiment.

In the example shown in FIG. 37 and explained in the fifteenth embodiment, the signal makes L→H→L→H→L→H→L→H transitions as a whole, which means that the signal makes seven transitions in total. If, in those sections shown in FIG. 37, the number of transitions made by a signal compared is other than seven, it is determined that the circuit to be verified does not operate correctly. On the other hand, when the number of falls and the number of rises are seen, it is found that the four L to H transitions and the three H to L transitions are made. If the number of L to H transitions is other than four, it is determined that the circuit does not operate properly. Furthermore, when the signal transition in each cycle is seen, the signal undergoes one L to H transition in the first cycle. Thus, if the number of signal transitions in the first cycle is other than one, it is determined that the circuit does not operate correctly. In this manner, in the operation check method and the semiconductor integrated circuit verification method of this embodiment, whether or not the circuit operates properly is determined based on the number of signal transitions.

With reference to FIGS. 42 and 43, the specific procedure of the semiconductor integrated circuit verification method of this embodiment will be described.

First, dynamic verification 401 is performed for an integrated circuit to be verified and simulation result 402 is obtained.

Then, the simulation result 402 and operation expected values 403, which have been prepared separately, are used to make an operation check in accordance with signal transitions. In this step, whether or not the integrated circuit operates correctly is determined by monitoring the number of signal transitions as described above. In a case where only the number of signal level transitions is desired to be checked, the procedure may be ended with this step. In a case where operation of the integrated circuit is to be verified, the procedure goes to the next step.

Subsequently, as shown in FIG. 43, effective path extraction 415 is performed by an effective path extraction means. In this step, an effective path in each cycle is specified by the method explained in the thirteenth embodiment, for example.

Subsequently, extraction of expected value comparison times or expected value verification 416 is carried out using the result of the operation check based on the signal transitions and the result of the effective path extraction. By performing the effective path extraction 415 prior to this step, it becomes possible to quickly check beforehand whether or not the data used in the expected value comparison time extraction or the expected value verification is the data that is obtained when the circuit operates properly.

In the semiconductor integrated circuit verification method of this embodiment, it is possible to effectively prepare a test pattern for detecting types of faults that cannot be detected by conventional tests. Moreover, if the expected value comparison time extraction or the expected value verification is also performed, the circuit operation verification can be conducted without causing a significant increase in the verification time.

In the above described exemplary case, the operation expected values to be referenced and the simulation result obtained in a target mode are used. However, the verification method of this embodiment is applicable to cases where simulation results obtained in multiple modes such as a MIN condition and a MAX condition are input.

Seventeenth Embodiment

Figure 44:
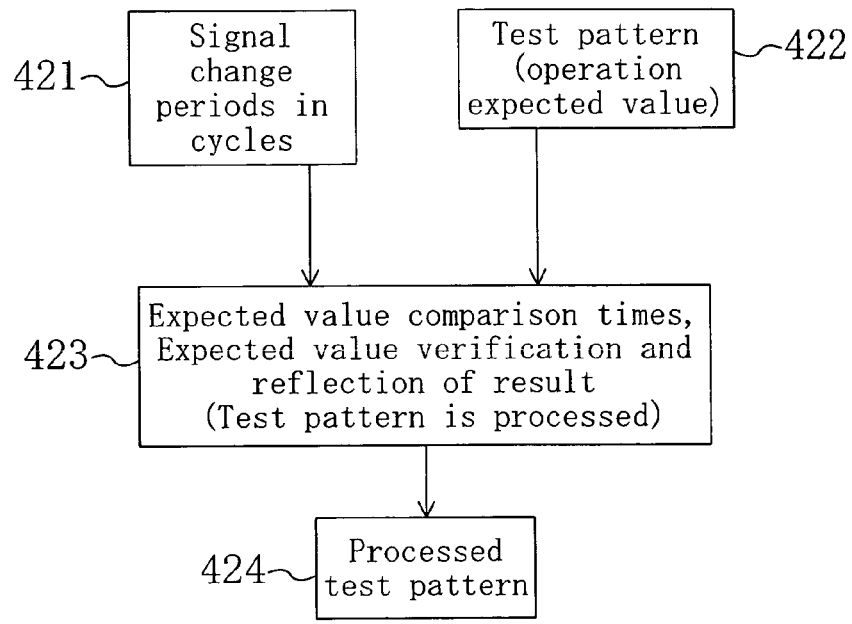
FIG. 44 is a flowchart indicating a test pattern processing method according to a seventeenth embodiment of the present invention.
Figure 45:
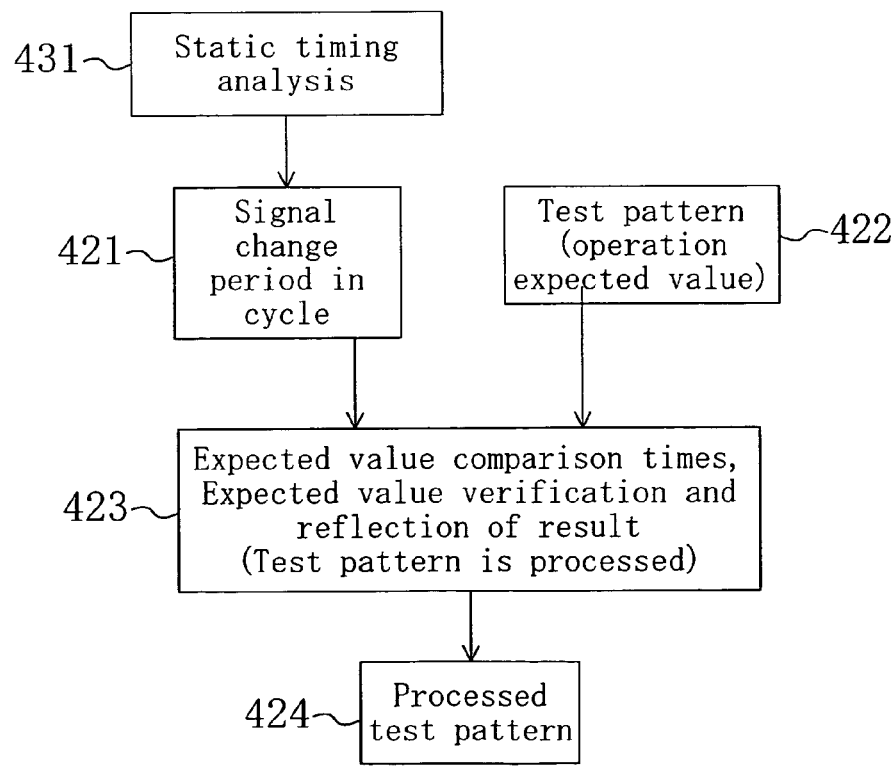
FIG. 45 is a flowchart indicating a test pattern processing method, in which static timing analysis is used, according to the seventeenth embodiment of the present invention.
Figure 46:
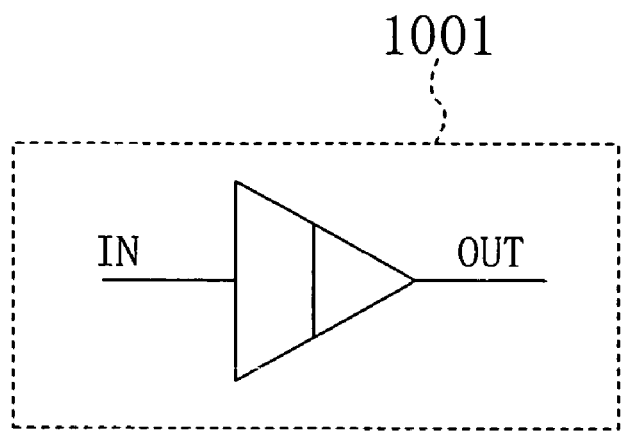
FIG. 46 is a view illustrating an ordinary library used in a typical conventional semiconductor integrated circuit verification method.
Figure 47:
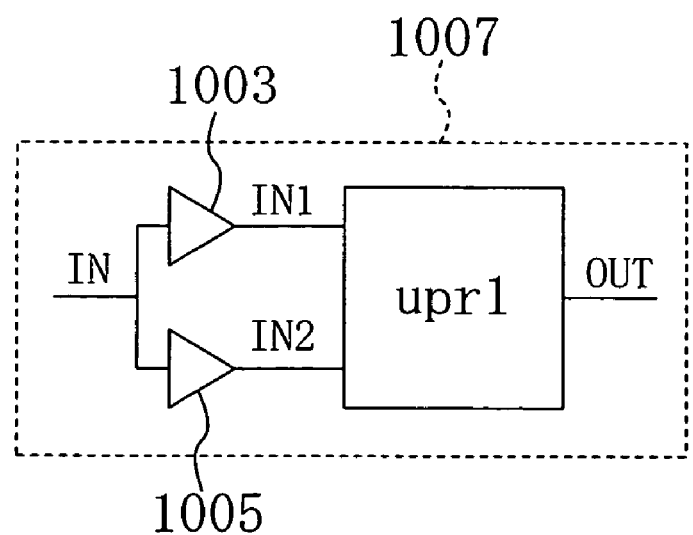
FIG. 47 is a view illustrating an ordinary library used in a semiconductor integrated circuit verification method according to a first conventional example.
Figure 48:
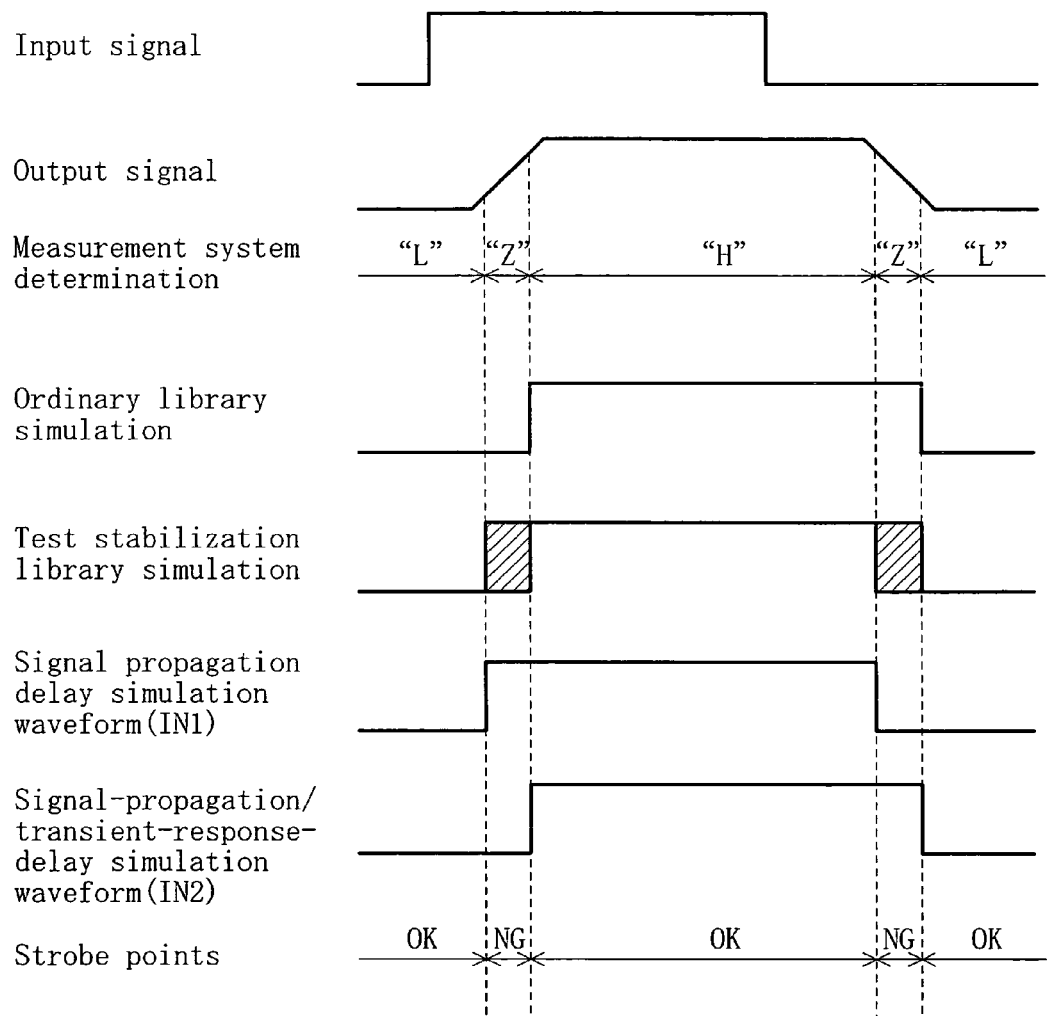
FIG. 48 is an explanatory timing chart indicating the semiconductor integrated circuit verification method of the first conventional example.
Figure 49:
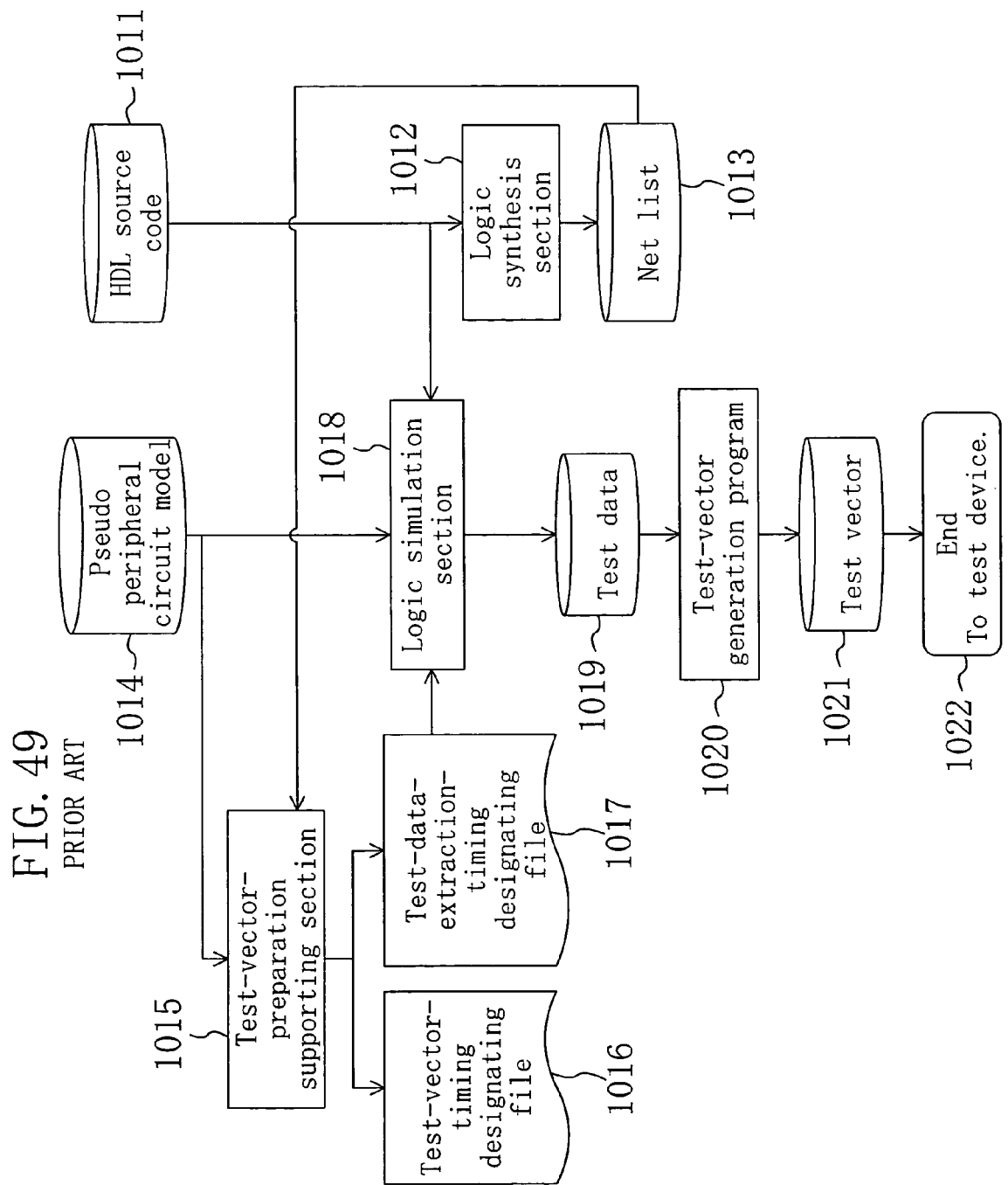
FIG. 49 is a flowchart schematically indicating a test pattern preparation method according to a second conventional example.

FIGS. 44 and 45 are flowcharts each indicating a test pattern processing method according to a seventeenth embodiment of the present invention.

In the semiconductor integrated circuit verification methods described in the foregoing embodiments, expected value comparison times are extracted using signal change periods in test cycles and operation expected values, and in a case where the expected value comparison times have been established in advance, expected value verification as to whether or not values of an actual output signal match the operation expected values is performed.

On the other hand, as shown in FIGS. 44 and 45, it will be described in this embodiment how to prepare a processed test pattern 424 by performing processing 423 of an original test pattern by using signal change periods 421 in test cycles obtained by timing verification and operation expected values 422 of the original test pattern.

Hereinafter, with reference to FIGS. 44 and 45, the specific procedure of the test pattern preparation methods of this embodiment will be described.

First, signal change periods 421 in test cycles are prepared. The signal change periods 421 in the test cycles may be extracted by a verification tool such as STA as shown in FIG. 45 or may be extracted in an actual device using a test apparatus. When STA is used, dynamic verification is not necessary, which allows faster processing.

Next, test pattern processing 423 is carried out using the signal change periods 421 in the test cycles, thereby generating a processed test pattern 424. In this step, a cycle(s) in which no expected value comparison can be made is masked, or the expected value comparison time in that cycle(s) is changed so as to be based on a different timing, for example.

In this manner, according to this method, a test pattern having stable strobe points is prepared to increase the accuracy of the test pattern, while the number of steps necessary for preparing the test pattern is reduced, which finally enables a more precise and highly accurate circuit test as compared with the conventional cases.

As mentioned above, the semiconductor integrated circuit verification methods and the test pattern preparation methods of the present invention are used to test LSIs and applicable to development and fabrication of semiconductor integrated circuits, for example.

What is claimed is:

1. A semiconductor integrated circuit verification method, in which a circuit verification is performed using an output signal which is output from an integrated circuit to be verified according to a test pattern that has been input to the integrated circuit, the method comprising:

performing timing verification under a plurality of delay conditions thereby obtaining the shortest signal change period in the test cycle, and extracting an expected value comparison timing point, at which a value of the output signal is compared with an expected value, based on the expected value and a period of time in a test cycle in which the signal changes, wherein the period of time in the test cycle in which the signal changes is obtained by static timing analysis of the integrated circuit, in the extraction of the expected value comparison timing point, the expected value comparison timing point is set in a period of time in which values of the signal obtained under a respective delay condition are equal to the expected value.

2. The method of claim 1, wherein the signal change period under a specified condition in the test cycle is obtained at least by timing verification of the integrated circuit.

3. The method of claim 2, wherein if the test cycle includes no period of time in which values of the signal obtained under the respective delay conditions are equal to the operation expected value, the cycle is treated as a cycle in which no expected value comparison is possible.

4. The method of claim 1, wherein a signal changeability term based on signal change periods under specified conditions is obtained by timing verification of the integrated circuit, and the expected value comparison time is set in a period of time other than the signal changeability period.

5. The method of claim 1, wherein the test pattern is input from a test apparatus, and the method further includes determining whether the extraction of the expected value comparison timing point is performed within a range of measurement capability of the test apparatus.

6. The method of claim 5, further comprising determining whether a delay time of the signal in the test cycle is within a delay constraint of the test apparatus.

7. The method of claim 1, further comprising:

before extracting the expected value comparison timing point, obtaining a period of time required for the signal to change in level as a signal transition period; and adding the signal transition period to the signal change period in the test cycle, thereby obtaining a combined signal change period, wherein in the extraction of the expected value comparison timing point, the combined signal change period is used.

8. The method of claim 7, wherein the expected value comparison timing point is not set at least within the signal transition period.

9. The method of claim 7, wherein a signal transition period calculation means calculates the signal transition period by using at least load capacity of the test apparatus as a parameter.

10. The method of claim 9, further comprising:

obtaining load absence delay information on the signal, the information being received by the test apparatus when it is assumed that there is no load capacity in the test apparatus where the signal transition needs no time, and obtaining load presence delay information on the signal, the information being received by the test apparatus when there is load capacity in the test apparatus, wherein the signal transition period calculation means calculates the signal transition period using the load absence delay information and the load presence delay information.

11. The method of claim 7, wherein the signal transition period calculation means calculates the signal transition period by using, as a parameter, at least a frequency of the signal that propagates in the integrated circuit.

12. The method of claim 11, further comprising:

before the signal transition period calculation means calculates the signal transition period, performing simulation of the integrated circuit using a simulation apparatus, and using a signal frequency extraction means to extract the frequency of the signal using at least result of the simulation, wherein, the signal transition period calculation means calculates the signal transition period based on the frequency of the signal extracted by the signal frequency extraction means.

13. The method of claim 7, further comprising preparing a database where a condition, which affects the signal transition period, and the signal transition period obtained when the condition is used are stored, wherein the signal change period in the test cycle includes the signal transition period retrieved from the database.

14. The method of claim 1, wherein the extraction of the expected value comparison timing point is performed by grouping based on the operation expected value.

15. The method of claim 1, wherein the integrated circuit includes a terminal for outputting the signal in accordance with a clock signal asynchronous with a reference clock signal;
the method further includes converting the signal output from the terminal into another signal, based on signal change in, and a period of, the reference clock signal; and
the signal change period in the test cycle is calculated for the signal output from the terminal by using said other signal.

16. The method of claim 1, wherein the extraction of the expected value comparison timing point is performed by grouping based on the operation expected delay timing.

17. A semiconductor integrated circuit verification method, in which operation verification is performed using a signal which is output from an integrated circuit to be verified according to a test pattern that has been input to the integrated circuit, the method comprising the steps of:
(a) extracting an expected value comparison time, at which a value of the signal is compared with an operation expected value, by using the operation expected value and a period of time in a test cycle in which the signal changes; and
(b) before the step (a), performing timing verification under a plurality of delay conditions, thereby obtaining at least the signal change period in the test cycle, wherein
the signal change period in the test cycle is obtained at least by static timing verification of the integrated circuit,
in the step (a), the expected value comparison time is set in a period of time in which values of the signal obtained under the respective delay conditions are both equal to the operation expected value,
the integrated circuit has a plurality of signal paths connected to a specific node, and
the method further includes, before the step (a), the step (c) in which a verification tool obtains signal change information at the specific node from result of dynamic verification of the integrated circuit, checks a delay time in the signal change, and then checks through which one of the signal paths the signal passes in each of cycles of the signal.

18. The method of claim 17, further comprising:
the step (d) of obtaining result of timing verification performed in an identical mode as the dynamic verification of the integrated circuit, the result including path information and the signal change period in the test cycle for each of the signal paths, and
before the step (a), the step (e) of extracting an effective one of the paths based on the path information, the signal change period in the test cycle for each signal path, and result of the path check obtained in the step (c).

19. The method of claim 18, wherein the result of the dynamic verification is obtained by performing the dynamic verification in a plurality of modes.

20. The method of claim 17, further comprising:
the step (f) of obtaining result of dynamic verification of the integrated circuit at least in one mode;
the step (g) of extracting an effective path by using the dynamic verification result;
the step (h) of obtaining timing verification result including path information on the integrated circuit and the signal change period in the test cycle; and
the step (i) of preparing, in a pseudo manner, result of dynamic verification in a mode different from the mode of the dynamic verification result obtained in the step (f), by using the timing verification result and result of the effective path extraction.

* * * * *